US012787686B2

(12) United States Patent
Kasamatsu et al.

(10) Patent No.: US 12,787,686 B2
(45) Date of Patent: Nov. 3, 2026

(54) GAS SUPPLIER, PROCESSING APPARATUS, AND METHOD OF MANUFACTURING SEMICONDUCTOR DEVICE

(71) Applicant: Kokusai Electric Corporation, Tokyo (JP)

(72) Inventors: Kenta Kasamatsu, Toyama (JP); Atsushi Hirano, Toyama (JP); Tetsuo Yamamoto, Toyama (JP); Takafumi Sasaki, Toyama (JP)

(73) Assignee: KOKUSAI ELECTRIC CORPORATION, Tokyo (JP)

( * ) Notice: Subject to any disclaimer, the term of this patent is extended or adjusted under 35 U.S.C. 154(b) by 759 days.

(21) Appl. No.: 18/159,457

(22) Filed: Jan. 25, 2023

(65) Prior Publication Data

US 2023/0253222 A1 Aug. 10, 2023

(30) Foreign Application Priority Data

Feb. 7, 2022 (JP) ................................ 2022-017389
Dec. 20, 2022 (JP) ................................ 2022-203640

(51) Int. Cl.
*H10P 72/00* (2026.01)
*H10P 14/60* (2026.01)
*H10P 90/00* (2026.01)

(52) U.S. Cl.
CPC ...... *H10P 72/0468* (2026.01); *H10P 14/6328* (2026.01); *H10P 14/6512* (2026.01); *H10P 90/128* (2026.01)

(58) Field of Classification Search
None
See application file for complete search history.

(56) References Cited

U.S. PATENT DOCUMENTS 4,992,301 A * 2/1991 Shishiguchi ............ C30B 25/14 118/724
2012/0156886 A1 6/2012 Shirako et al.
2015/0275368 A1 10/2015 Motoyama et al.
2017/0051408 A1 2/2017 Takagi et al.
(Continued)

FOREIGN PATENT DOCUMENTS

CN 108630577 A 10/2018
CN 113818008 A 12/2021
(Continued)

OTHER PUBLICATIONS

Machine translation of JP 2011-29441-A (Year: 2011).*
(Continued)

*Primary Examiner* — Erik Kielin
(74) *Attorney, Agent, or Firm* — Volpe Koenig

(57) ABSTRACT

There is provided a technique that includes a first opening and a second opening which supply gases to a process chamber in which a substrate is arranged, and is configured such that: the first opening and the second opening are arranged in a direction parallel to a surface of the substrate, a gas supplied from the first opening is supplied toward a center of the substrate, a gas supplied from the second opening is supplied toward a peripheral edge of the substrate, and a direction of the gas supplied from the second opening forms a predetermined angle with respect to a direction of the gas supplied from the first opening.

17 Claims, 18 Drawing Sheets

(56) References Cited

U.S. PATENT DOCUMENTS

| | | | |
|---|---|---|---|
| 2017/0073811 A1 | | 3/2017 | Kikuchi |
| 2018/0264516 A1 | | 9/2018 | Fujikawa et al. |
| 2019/0096738 A1 | | 3/2019 | Okajima et al. |
| 2019/0360098 A1 | | 11/2019 | Shimada et al. |
| 2020/0035852 A1 | | 1/2020 | Chang et al. |
| 2021/0180185 A1 | | 6/2021 | Hara et al. |
| 2021/0395893 A1 | | 12/2021 | Sakashita et al. |
| 2022/0119949 A1 | | 4/2022 | Nagatomi et al. |
| 2022/0285174 A1 | * | 9/2022 | Kong ................ H01L 21/67011 |

FOREIGN PATENT DOCUMENTS

| | | | | |
|---|---|---|---|---|
| JP | 2011029441 | A | * | 2/2011 |
| JP | 2012023073 | A | * | 2/2012 |
| JP | 2017-055034 | A | | 3/2017 |
| JP | 2018-157028 | A | | 10/2018 |
| JP | 2019-062053 | A | | 4/2019 |
| JP | 2019-203182 | A | | 11/2019 |
| JP | 2020-017729 | A | | 1/2020 |
| JP | 2021-097245 | A | | 6/2021 |
| KR | 10-2018-0106888 | A | | 10/2018 |
| KR | 10-2019-0022590 | A | | 3/2019 |
| TW | 201842980 | A1 | | 12/2018 |
| WO | 2020053960 | A1 | | 3/2020 |
| WO | 2021/020008 | A1 | | 2/2021 |

OTHER PUBLICATIONS

JP-2012023073-A Machine Translation (Year: 2012).*

European Search Report issued on Jun. 29, 2023 for European Patent Application No. 23152854.8.

Chinese Office Action issued on Jun. 12, 2025 for Chinese Patent Application No. 202211713165.4.

Taiwan Office Action issued on Feb. 26, 2024 for Taiwan Patent Application No. 111149613.

Japanese Office Action issued on Feb. 6, 2024 for Japanese Patent Application No. 2022-203640.

Korean Office Action issued on Apr. 29, 2025 for Korean Patent Application No. 10-2023-0007971.

* cited by examiner

FIG. 6
| | Present embodiment | Conventional |
|---|---|---|
| Gas nozzle cross section | 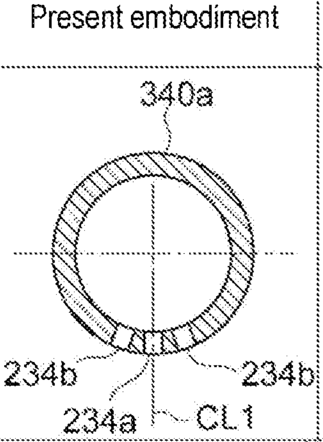  | 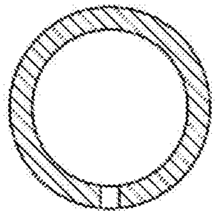 |
| Gas flow | 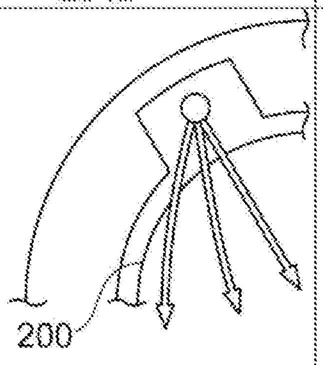  | 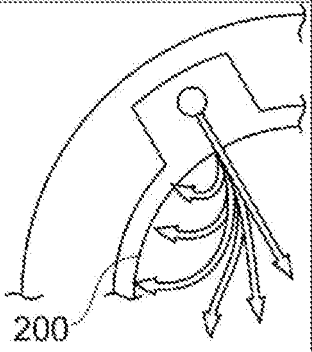  |
| Gas partial pressure | 1.5Pa | 5.7Pa |

FIG. 8
| | Evaluation Example 1 | Evaluation Example 2 | Evaluation Example 3 |
| --- | --- | --- | --- |
| Hole diameter ratio | 1:1:1 | 0.85:1:0.85 | 0.75:1:0.75 |
| | Second opening / First opening / Second opening | Second opening / First opening / Second opening | Second opening / First opening / Second opening |
| Gas flow | 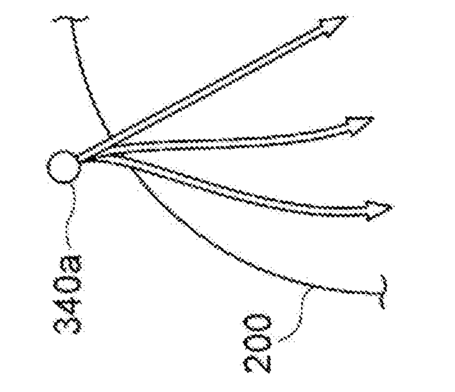  | 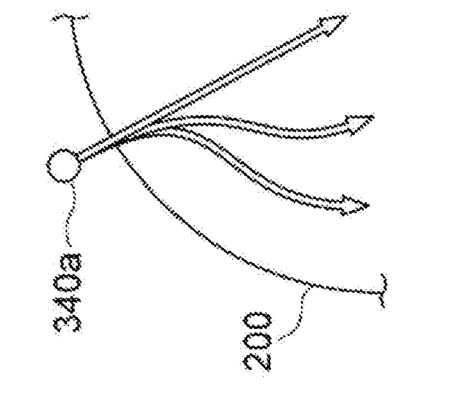  | 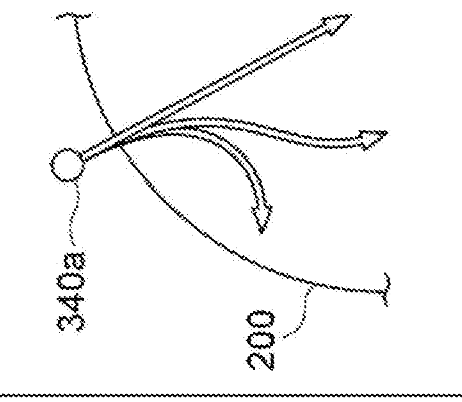  |
| Wafer region Return flow | No | No | Yes |

FIG. 9

| | Evaluation Example 1 | | | Evaluation Example 2 | | | Evaluation Example 3 | | |
|---|---|---|---|---|---|---|---|---|---|
| Hole diameter ratio | 1:1:1 | | | 0.85:1:0.85 | | | 0.75:1:0.75 | | |
| Cross-sectional area ratio of opening | Second opening | First opening | Second opening | Second opening | First opening | Second opening | Second opening | First opening | Second opening |
| | 1 | 1 | 1 | 0.7 | 1 | 0.7 | 0.5 | 1 | 0.5 |
| Wafer region Return flow | No | | | No | | | Yes | | |
| Flow rate ratio | 0.99 | 0.97 | 1 | 0.69 | 1 | 0.69 | 0.49 | 1 | 0.49 |
| Gas partial pressure | 1.5 Pa | | | 2.7 Pa | | | 4.0 Pa | | |

FIG. 10
| | Evaluation Example 4 | Evaluation Example 5 | Evaluation Example 6 | Evaluation Example 7 | Evaluation Example 8 |
|---|---|---|---|---|---|
| Hole diameter | φ2.7-2.7-2.7 | | | | |
| Inclination angle R1 | 20° | 25° | 30° | 35° | 40° |
| | 20° inclined 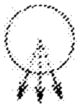 | 25° inclined  | 30° inclined 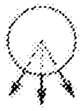 | 35° inclined 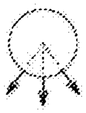 | 40° inclined  |
| Gas flow | 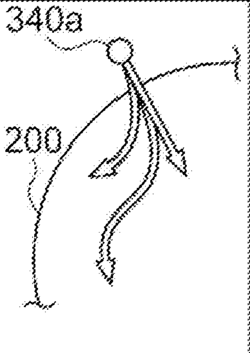  | 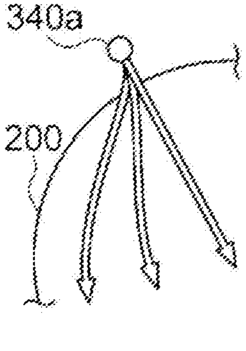  | 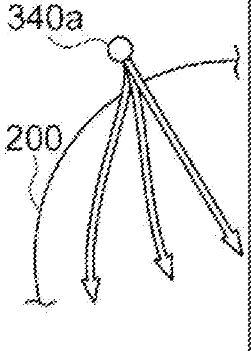  | 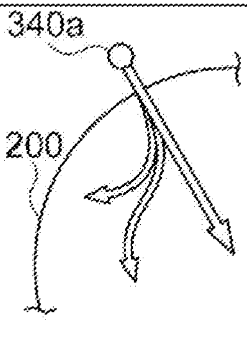  | 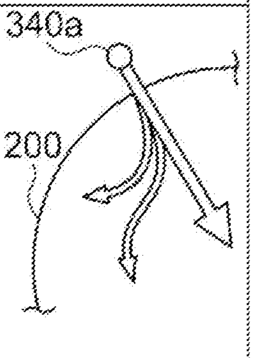  |
| Wafer region Return flow | No | No | No | Yes | Yes |
| Gas partial pressure | 2.6 Pa | 2.9 Pa | 3.1 Pa | 7.8 Pa | 9.7 Pa |

FIG. 11

| | | | | | |
|---|---|---|---|---|---|
| Evaluation Example 9 | HCD flow rate:3slm → | Analysis result | Second opening | First opening | Second opening |
| | | Flow rate ratio | 0.997 | 0.976 | 1 |
| | | Flow rate uniformity ±% | ±1.20% | | |
| Evaluation Example 10 | HCD flow rate:5.9slm → | Analysis result | Second opening | First opening | Second opening |
| | | Flow rate ratio | 0.993 | 0.970 | 1 |
| | | Flow rate uniformity ±% | ±1.52% | | |
| Evaluation Example 11 | HCD flow rate:12slm → | Analysis result | Second opening | First opening | Second opening |
| | | Flow rate ratio | 0.989 | 0.984 | 1 |
| | | Flow rate uniformity ±% | ±0.81% | | |

FIG. 18

| | Evaluation example 12 | | | Evaluation example 13 | | | Evaluation example 14 | | | Evaluation example 15 | | |
|---|---|---|---|---|---|---|---|---|---|---|---|---|
| Hole diameter ratio | 1.19:1:1.19 | | | 1.85:1:1.85 | | | 2.41:1:2.41 | | | 3.33:1:3.33 | | |
| Gas flow ratio | Second opening | First opening | Second opening | Second opening | First opening | Second opening | Second opening | First opening | Second opening | Second opening | First opening | Second opening |
| | 1.68 | 1 | 1.67 | 5.79 | 1 | 5.51 | 13.92 | 1 | 13.65 | 48.99 | 1 | 47.27 |
| Cross-sectional area ratio of opening | 1.4:1:1.4 | | | 3.4:1:3.4 | | | 5.8:1:5.8 | | | 11.1:1:11.1 | | |
| Gas flow | 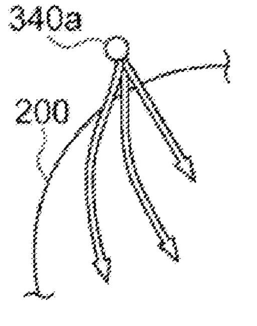  | | | 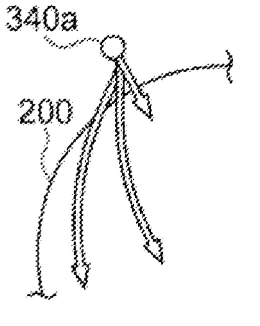  | | | 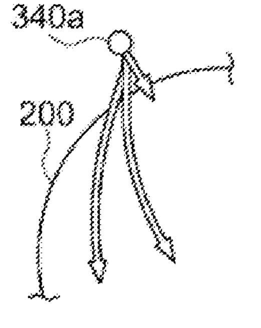  | | | 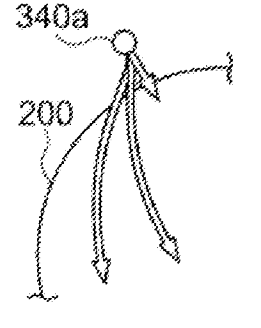  | | |
| Wafer region return flow | No | | | No | | | No | | | No | | |
| Gas partial pressure | 0.9 Pa | | | 0.8 Pa | | | 1.2 Pa | | | 2.1 Pa | | |

GAS SUPPLIER, PROCESSING APPARATUS, AND METHOD OF MANUFACTURING SEMICONDUCTOR DEVICE

CROSS-REFERENCE TO RELATED APPLICATIONS

This application is based upon and claims the benefit of priority from Japanese Patent Application Nos. 2022-017389 and 2022-203640, filed on Feb. 7, 2022 and Dec. 20, 2022, respectively, the entire contents of which are incorporated herein by references.

TECHNICAL FIELD

The present disclosure relates to a gas supplier, a processing apparatus, and a method of manufacturing a semiconductor device.

BACKGROUND

As a process of manufacturing a semiconductor device, there may be a case that a process of forming a film on a substrate is performed. In the related art, a nozzle for supplying a processing gas and a nozzle for supplying an inert gas are installed. The inert gas which does not contribute to the processing of a substrate is supplied so that the processing gas flows evenly on the substrate. However, it may still be difficult to allow the processing gas to flow evenly.

SUMMARY

Some embodiments of the present disclosure provide a technique capable of allowing a processing gas to flow evenly over a substrate.

According to one embodiment of the present disclosure, there is provided a technique that includes a first opening and a second opening which supply gases to a process chamber in which a substrate is arranged, and is configured such that: the first opening and the second opening are arranged in a direction parallel to a surface of the substrate, a gas supplied from the first opening is supplied toward a center of the substrate, a gas supplied from the second opening is supplied toward a peripheral edge of the substrate, and a direction of the gas supplied from the second opening forms a predetermined angle with respect to a direction of the gas supplied from the first opening.

BRIEF DESCRIPTION OF DRAWINGS

The accompanying drawings, which are incorporated in and constitute a part of the specification, illustrate embodiments of the present disclosure.

The accompanying drawings, which are incorporated in and constitute a part of the specification, illustrate embodiments of the present disclosure.

FIG. 6 is a table showing a simulation result of the gas supplier according to embodiments of the present disclosure and a simulation result of a conventional gas supplier.

FIG. 8 is a table of simulation results of the gas supplier according to embodiments of the present disclosure, showing a gas flow and the like when a hole diameter of a second opening is changed.

FIG. 9 is a table of simulation results of the gas supplier according to embodiments of the present disclosure, showing a flow rate ratio and the like when a hole diameter of a second opening is changed.

FIG. 10 is a table of simulation results of the gas supplier according to embodiments of the present disclosure, showing a gas flow and the like when an inclination angle of a second opening is changed.

FIG. 11 is a table of simulation results of the gas supplier according to embodiments of the present disclosure, showing a flow rate ratio and the like when a flow rate of the gas flowing through the gas nozzle is changed.

FIG. 18 is a diagram showing, in a table, a gas flow and the like when a hole diameter of a second opening is changed, which is a simulation result of the gas supplier according to embodiments of the present disclosure.

DETAILED DESCRIPTION

Figure 1:
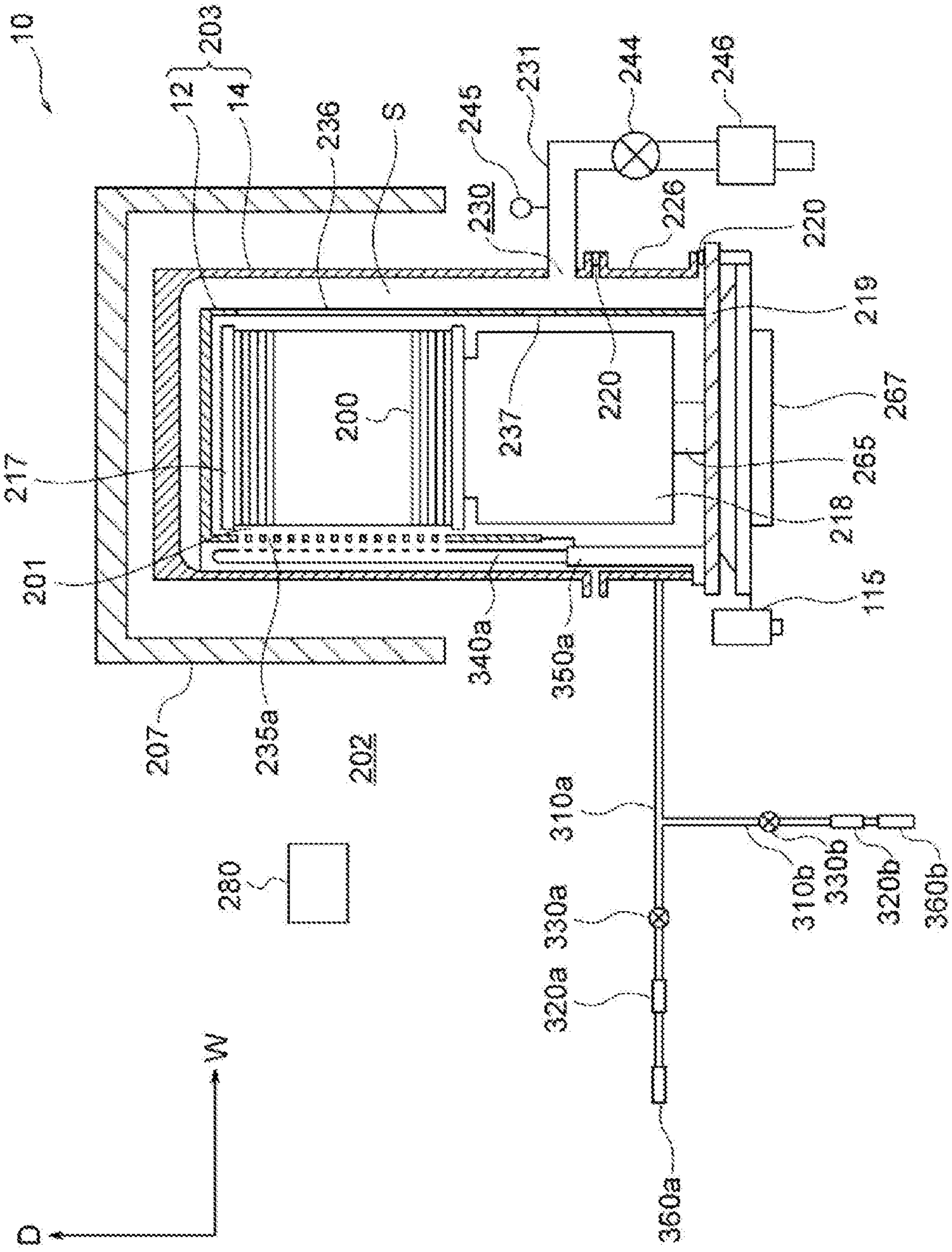
FIG. 1 is a schematic configuration diagram showing a substrate processing apparatus according to embodiments of the present disclosure.

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

Embodiments of the Present Disclosure

Embodiments of the present disclosure will be described below with reference to FIGS. 1 to 18. The drawings used in the following description are all schematic. Further, the relationship of dimensions of the respective elements, the ratios of the respective elements, and the like shown in the drawings do not necessarily match the actual ones. Moreover, the dimensional relationship of the respective elements, the ratios of the respective elements, the like do not necessarily match between a plurality of drawings. In addition, arrow H shown in the drawings indicates the vertical direction of the apparatus, arrow W indicates the width direction of the apparatus (horizontal direction), and arrow D indicates the depth direction of the apparatus (horizontal direction).

(Overall Configuration of Substrate Processing Apparatus 10)

As shown in FIG. 1, the substrate processing apparatus 10 includes a controller 280 for controlling each part and a process furnace 202. The process furnace 202 includes a heater 207 as a heating means. The heater 207 has a vertically extending cylindrical shape and has an open lower end. The heater 207 is supported by a heater base (not shown). The heater 207 also functions as an activation mechanism that thermally activates a processing gas. Details of the controller 280 will be described later.

Inside the heater 207, a reaction tube 203 constituting a reaction container is arranged concentrically with the heater 207. The reaction tube 203 is made of a heat-resistant material such as quartz ($SiO_2$) or silicon carbide (SiC). The substrate processing apparatus 10 is of a so-called hot wall type.

The reaction tube 203 includes a cylindrical inner tube 12 and a cylindrical outer tube 14 surrounding the inner tube 12. The inner tube 12 is arranged concentrically with the outer tube 14. A gap S is formed between the inner tube 12 and the outer tube 14.

Figure 2:
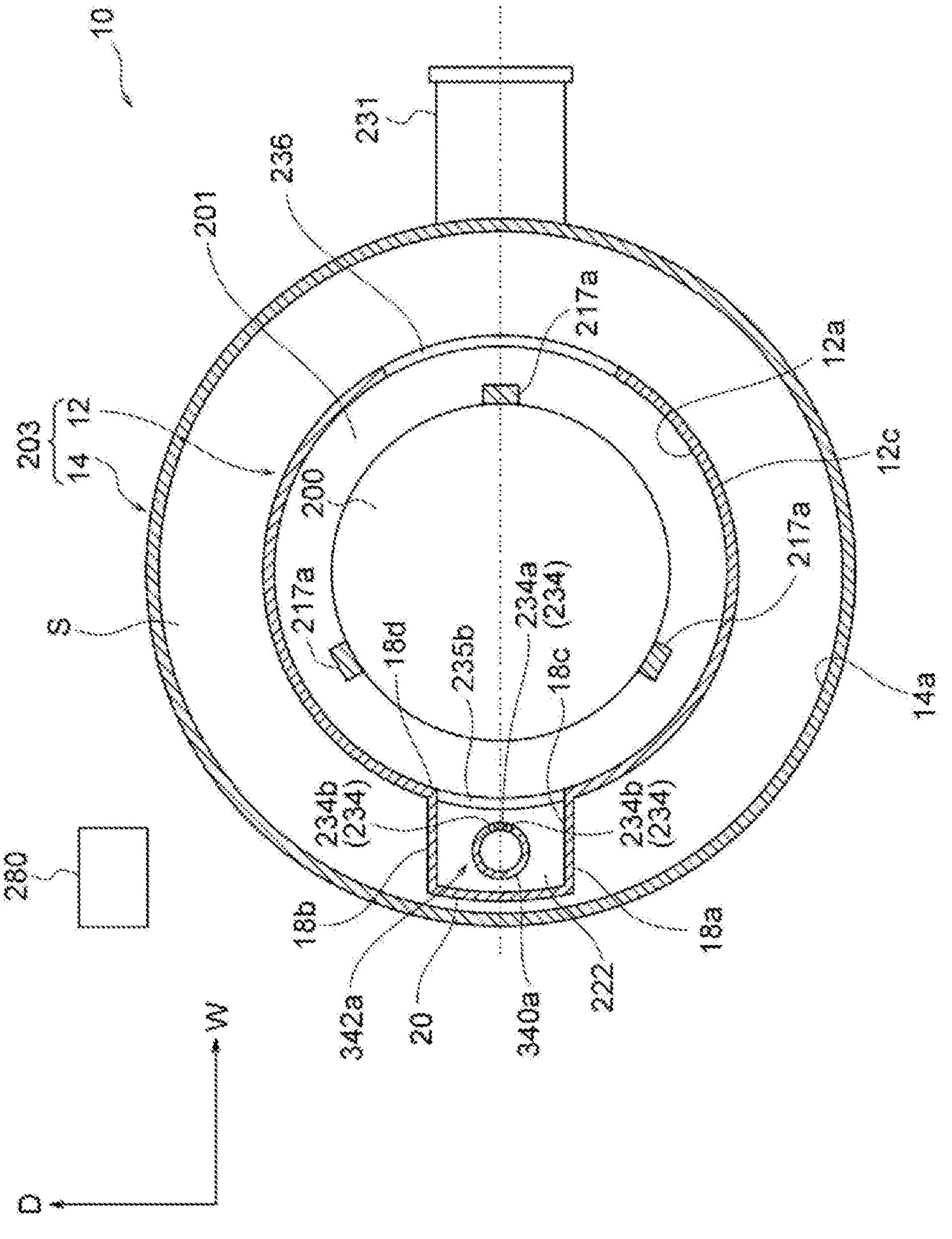
FIG. 2 is a sectional view showing a gas supplier, a reaction tube, and the like of the substrate processing apparatus according to embodiments of the present disclosure.

The inner tube 12 has a cylindrical shape with an open lower end and a flat closed upper end. The outer tube 14 also has a cylindrical shape with an open lower end and a flat closed upper end. Further, as shown in FIG. 2, a nozzle chamber 222 is formed in the gap S between the inner tube 12 and the outer tube 14. Details of the nozzle chamber 222 will be described later.

Inside the inner tube 12, as shown in FIG. 1, a process chamber 201 for processing a wafer 200 as a substrate is formed. In addition, the process chamber 201 may accommodate a boat 217 which is an example of a substrate holder capable of holding wafers 200 in a horizontal posture and in multiple stages in a vertical direction. The inner tube 12 surrounds the wafers 200 accommodated therein.

Further, a supply slit 235*a* and a first exhaust port 236, which is an example of an exhauster formed so as to face the supply slit 235*a*, are formed in a peripheral wall of the inner tube 12. The supply slit 235*a* extends in a horizontal direction, and is vertically arranged and formed in a plural number. A second exhaust port 237 having an opening area smaller than that of the first exhaust port 236 is formed below the first exhaust port 236 in the peripheral wall of the inner pipe 12.

The lower end of the reaction tube 203 is supported by a cylindrical manifold 226. The manifold 226 is made of a metal such as nickel alloy or stainless steel, or made of a heat-resistant material such as quartz or SiC. A flange is formed at the upper end of the manifold 226, and the lower end of the outer tube 14 is installed on this flange. An airtight member 220 such as an O-ring or the like is arranged between the flange and the lower end of the outer tube 14 to keep the inside of the reaction tube 203 airtight.

A seal cap 219 is airtightly attached to the lower end opening of the manifold 226 via an airtight member 220 such as an O-ring or the like. Thus, the lower end opening of the reaction tube 203 is airtightly closed. The seal cap 219 is made of a metal such as a nickel alloy or stainless steel, and is formed in a disk-like shape. A heat-resistant material such as quartz or SiC may also cover the outside of the seal cap 219.

A boat support 218 for supporting the boat 217 is installed on the seal cap 219. The boat support 218 is made of a heat-resistant material such as quartz or SiC, and functions as a heat insulating part.

A boat 217 is installed upright on the boat support 218. The boat 217 is made of a heat-resistant material such as quartz or SiC. The boat 217 includes a bottom plate (not shown) fixed to the boat support 218, a top plate disposed above the bottom plate, and a plurality of pillars 217*a* (see FIG. 2) arranged between the bottom plate and the top plate.

The boat 217 holds a plurality of wafers 200 to be processed in a process chamber 201 inside the inner tube 12. The wafers 200 are held at predetermined intervals in a horizontal posture, and are supported by the pillars 217*a* of the boat 217 with the centers thereof aligned with each other. In other words, the wafers 200 are arranged at the predetermined intervals in the vertical direction which is a plate thickness direction. The stacking direction of the wafers 200 is an axial direction of the reaction tube 203. In other words, the centers of the wafers 200 are aligned with the central axis of the boat 217, and the central axis of the boat 217 coincides with the central axis of the reaction tube 203.

A boat rotator 267 for rotating the boat 217 is installed below the seal cap 219. A rotary shaft 265 of the boat rotator 267 is connected to the boat support 218 through the seal cap 219. The boat rotator 267 rotates the boat 217 via the boat support 218 to thereby rotate the wafers 200.

The seal cap 219 is vertically moved up and down by an elevator 115 as an elevating mechanism installed outside the reaction tube 203. As a result, the boat 217 is loaded into and out of the process chamber 201.

In the manifold 226, a nozzle support 350*a* which supports a gas nozzle 340*a* as a supply pipe (supply pipe portion) for supplying a gas into the process chamber 201 is installed so as to penetrate the manifold 226. The nozzle support 350*a* is made of a material such as nickel alloy or stainless steel.

A gas supply pipe 310*a* for supplying a gas into the process chamber 201 is connected to one end of the nozzle support 350*a*. A gas nozzle 340*a* is connected to the other end of the nozzle support 350*a*. The gas nozzle 340*a* is made of a heat-resistant material such as quartz or SiC. Details of the gas nozzle 340*a* and the gas supply pipe 310*a* will be described later.

On the other hand, an exhaust port 230 is formed in the outer tube 14 of the reaction tube 203. An exhaust port 230 is formed below the second exhaust port 237. An exhaust pipe 231 is connected to the exhaust port 230.

A vacuum pump 246 as a vacuum-exhaust device is connected to the exhaust pipe 231 via a pressure sensor 245 which detects the pressure inside the process chamber 201 and an APC (Auto Pressure Controller) valve 244 as a pressure regulator. The exhaust pipe 231 on the downstream side of the vacuum pump 246 is connected to a waste gas treatment device (not shown) or the like. Thus, by controlling the output of the vacuum pump 246 and the opening degree of the APC valve 244, the process chamber 201 can be vacuum-exhausted such that the pressure inside the process chamber 201 is set to a predetermined pressure (degree of vacuum).

Further, a temperature sensor (not shown) as a temperature detector is installed inside the reaction tube 203, and the electric power supplied to the heater 207 is adjusted based on the temperature information detected by the temperature sensor so that the temperature inside the process chamber 201 has a desired temperature distribution.

According to this configuration, in the process furnace 202, the boat 217 on which the wafers 200 to be batch-processed are stacked in multiple stages is loaded into the process chamber 201 by the boat support 218. Then, the heater 207 heats the wafers 200 loaded into the process chamber 201 to a predetermined temperature. The apparatus having such a process furnace is called a vertical batch apparatus.

[Nozzle Chamber 222]

As shown in FIG. 2, the nozzle chamber 222 extending in the vertical direction is formed in a gap S between an outer peripheral surface 12*c* of the inner tube 12 and the inner peripheral surface 14*a* of the outer tube 14. Specifically, the nozzle chamber 222 is formed between a first partition 18*a* extending from the outer peripheral surface 12*c* of the inner tube 12 toward the outer tube 14 and a second partition 18*b* extending from the outer peripheral surface 12*c* of the inner tube 12 toward the outer tube 14 and between an arc-shaped top plate 20 connecting a tip of the first partition 18*a* and a tip of the second partition 18*b* and the inner tube 12.

[Gas Nozzle 340*a*]

The gas nozzle 340*a* extending in the vertical direction is arranged in the nozzle chamber 222 as shown in FIG. 2. The gas nozzle 340*a* is used as a processing gas nozzle for supplying a precursor gas or a reaction gas, which is a processing gas, into the process chamber 201. The gas nozzle 340*a* is configured as an I-shaped long nozzle. Further, openings 234 serving as gas injection holes for injecting a gas are formed on a peripheral surface of the gas nozzle 340*a* so as to face the supply slits 235*a* in a parallel direction (i.e., horizontal direction). The openings 234 includes first openings 234*a* and second openings 234*b*. A gas supplier 342*a* is configured to include the gas nozzle 340*a*. Details of the first openings 234*a* and the second openings 234*b* will be described later.

[Gas Supply Pipes 310*a* and 310*b*]

As shown in FIG. 1, the gas supply pipe 310*a* communicates with the gas nozzle 340*a* through the nozzle support 350*a*.

On the gas supply pipe 310*a*, a precursor gas supply source 360*a* for supplying a precursor gas as a processing gas, a mass flow controller (MFC) 320*a* which is an example of a flow rate controller, and a valve 330*a* are installed sequentially from an upstream side in a gas flow direction.

A gas supply system is composed of the precursor gas supply source 360*a*, the MFC 320*a*, and the valve 330*a*.

A gas supply pipe 310*b* for supplying an inert gas as a processing gas is connected to the gas supply pipe 310*a* on a downstream side of the valve 330*a* in a gas flow direction. On the gas supply pipe 310*b*, an inert gas supply source 360*b* which supplies an inert gas as a processing gas, an MFC 320*b*, and a valve 330*b* are installed sequentially from an upstream side in a gas flow direction. An inert gas supply system is composed of the inert gas supply source 360*b*, the MFC 320*b*, and the valve 330*b*.

[Controller 280]

Figure 3:
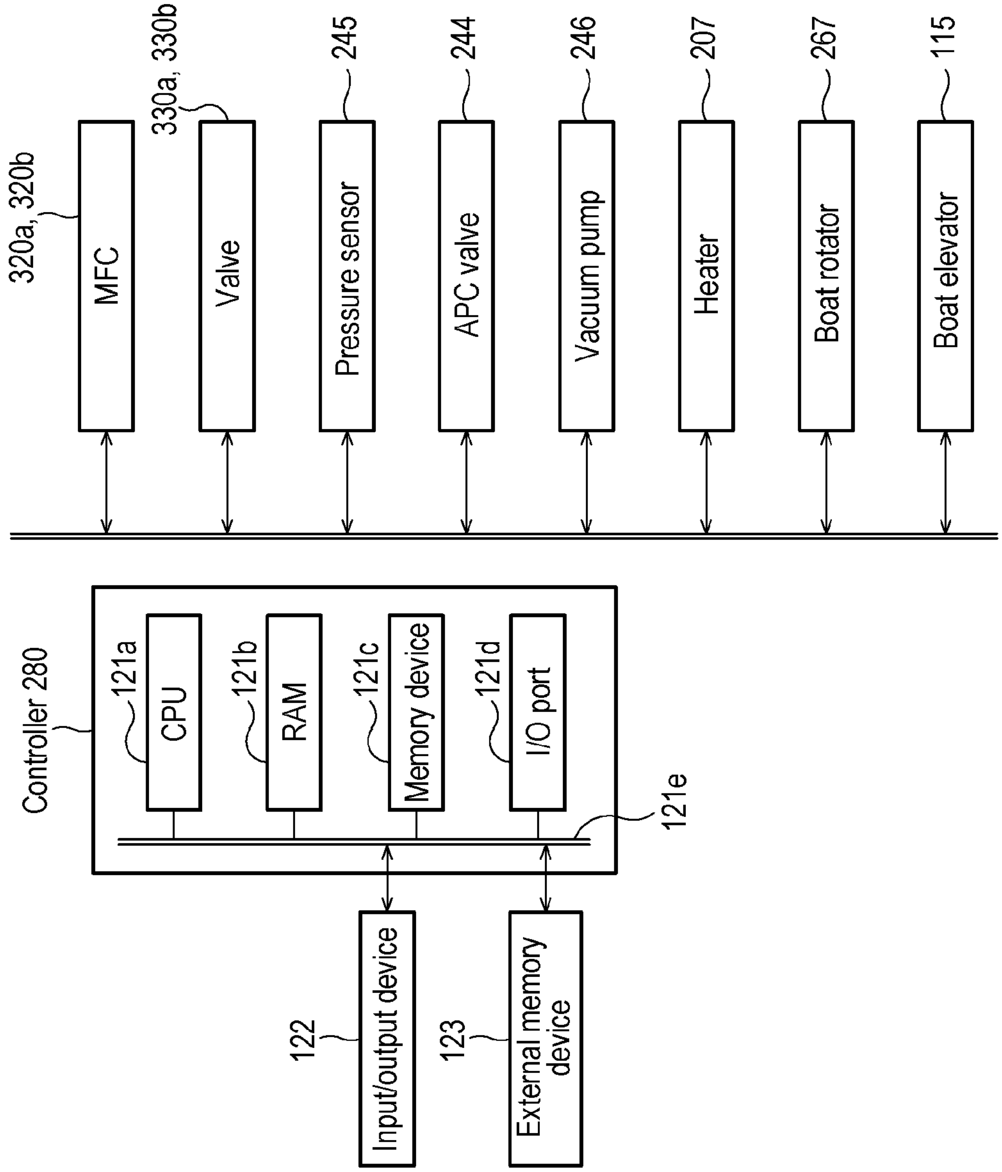
FIG. 3 is a block diagram showing a controller provided in the substrate processing apparatus according to embodiments of the present disclosure.

FIG. 3 is a block diagram showing a control configuration of the substrate processing apparatus 10. A controller 280 of the substrate processing apparatus 10 is configured as a computer. This computer includes a CPU (Central Processing Unit) 121*a*, a RAM (Random Access Memory) 121*b*, a memory device 121*c*, and an I/O port 121*d*.

The RAM 121*b*, the memory device 121*c*, and the I/O port 121*d* are configured to exchange data with the CPU 121*a* via an internal bus 121*e*. An input/output device 122 configured as, for example, a touch panel or the like is connected to the controller 280.

The memory device 121*c* is composed of, for example, a flash memory, an HDD (Hard Disk Drive), or the like. The memory device 121*c* readably stores a control program for controlling an operation of the substrate processing apparatus 10, a process recipe describing procedures and conditions for processing the substrate, which will be described later, and the like.

The process recipe is a combination that causes the controller 280 to execute each procedure in the below-described substrate processing process so as to obtain a predetermined result. The process recipe functions as a program. Hereinafter, the process recipe, the control program, and the like will be collectively and simply referred to as program.

When the term "program" is used in this specification, it may include only the process recipe, only the control program, or both of them. The RAM 121*b* is configured as a memory area (work area) in which programs and data read by the CPU 121*a* are temporarily held.

The I/O port 121*d* is connected to the MFCs 320*a* and 320*b*, the valves 330*a* and 330*b*, the pressure sensor 245, the APC valve 244, the vacuum pump 246, the heater 207, the temperature sensor, the boat rotator 267, the elevator 115, and the like.

The CPU 121*a* is configured to read a control program from the memory device 121*c* and execute the same. The CPU 121*a* is configured to read a process recipe from the memory device 121*c* in response to an input of an operation command from the input/output device 122 or the like.

The CPU 121*a* is configured to control, according to the content of the process recipe thus read, the flow rate adjustment operation for various gases by the MFCs 320*a* and 320*b*, the opening/closing operation of the valves 330*a* and 330*b*, and the opening/closing operation of the APC valve 244. The CPU 121*a* is also configured to control the pressure regulation operation by the APC valve 244 based on the pressure sensor 245, the start and stop of the vacuum pump 246, and the temperature adjustment operation of the heater 207 based on the temperature sensor. In addition, the CPU 121*a* is configured to control the rotation of the boat 217 and the rotation speed adjustment operation by the boat rotator 267, the elevating operation of the boat 217 by the elevator 115, and the like.

The controller 280 is not limited to being configured as a dedicated computer, and may be configured as a general-purpose computer. For example, the controller 280 of the present embodiment may be configured by preparing an external memory device 123 that stores the above-described program and installing the program in a general-purpose computer using the external memory device 123. Examples of the external storage device include a magnetic disk such as a hard disk or the like, an optical disk such as a CD or the like, a magneto-optical disk such as an MO or the like, and a semiconductor memory such as a USB memory or the like.

[Outline of Operation of Substrate Processing Apparatus]

Figure 4:
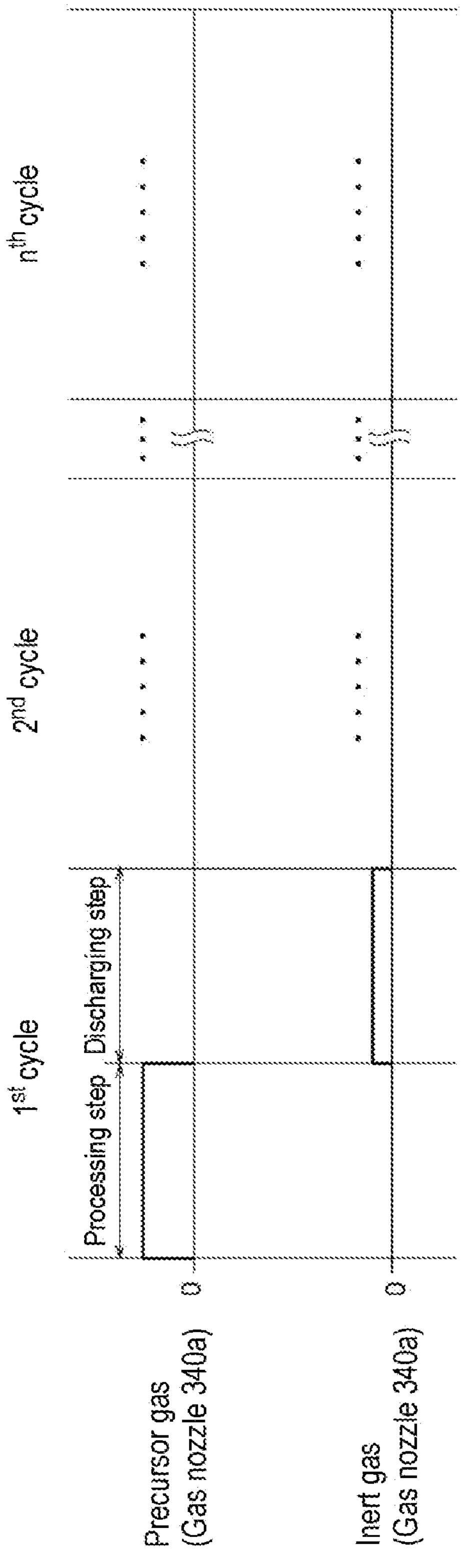
FIG. 4 is a diagram showing a film-forming sequence of a substrate processing apparatus according to embodiments of the present disclosure.

Next, an operation outline of the substrate processing apparatus 10 will be described according to a control procedure performed by the controller 280 using a film-forming sequence shown in FIG. 4. FIG. 4 is a graph showing a supply amount of a gas (vertical axis) and a timing of gas supply (horizontal axis) in the film-forming sequence according to the present embodiment. The boat 217 on which a predetermined number of wafers 200 is mounted in advance is loaded into the reaction tube 203, and the reaction tube 203 is airtightly closed by the seal cap 219.

When the control by the controller 280 is started, the controller 280 enables the vacuum pump 246 and the APC valve 244 shown in FIG. 1 to operate so as to exhaust an atmosphere in the reaction tube 203 from the exhaust port 230. Furthermore, the controller 280 controls the boat rotator 267 to start rotating the boat 217 and the wafers 200. This rotation continues at least until the processing of the wafers 200 is completed.

In the film-forming sequence shown in FIG. 4, the film formation on the wafers 200 is completed by performing a cycle including a processing step and a discharging step a predetermined number of times. Then, when the film formation is completed, the boat 217 is unloaded from the inside of the reaction tube 203 by the reverse procedure of the operation described above. Further, the wafers 200 are transferred from the boat 217 to a pod on a transfer shelf by a wafer transfer machine (not shown), and the pod is transferred from the transfer shelf to a pod stage by a pod transfer machine. In addition, the wafers 200 are unloaded to the outside of the housing by an external transfer device.

One cycle of the film-forming sequence will be described below. The valves 330*a* and 330*b* are kept closed before the film-forming sequence is executed.

[Processing Step]

When the atmosphere in the reaction tube 203 is exhausted from the exhaust port 230 by controlling each part with the controller 280, the controller 280 enables the valve 330*a* to be opened so as to inject a precursor gas from the openings 234 of the gas nozzle 340*a*.

At this time, the controller 280 enables the vacuum pump 246 and the APC valve 244 to operate so as to exhaust the atmosphere in the reaction tube 203 from the exhaust port 230 such that the pressure obtained from the pressure sensor 245 is constant, thereby setting the pressure in the reaction tube 203 to a negative pressure. As a result, the precursor gas flows in parallel over the wafers 200 and then flows from the top to the bottom of the gap S through the first exhaust port 236 and the second exhaust port 237. The precursor gas is exhausted from the exhaust pipe 231 through the exhaust port 230. In this case, the controller 280 controls the supply amount of the gas using the MFC 320*a*.

[Discharging Step]

When the first processing step is completed after a predetermined time has passed, the controller 280 enables the valve 330*a* to be closed so as to stop the supply of the precursor gas from the gas nozzle 340*a*. Furthermore, the controller 280 enables the valve 330*b* to be opened so as to inject an inert gas from the openings 234 of the gas nozzle 340*a*.

The discharging step may include a step of reducing the pressure while keeping the valve 330*b* closed (pressure reduction step). In the discharging step, the step of injecting the inert gas into the reaction tube 203 as described above (purging step) and the step of reducing the pressure may be repeated.

The processing of the wafers 200 is completed by executing one cycle including the processing step and the discharging step a predetermined number of times as described above. In the above description, one type of processing gas is used. However, in the case of using two types of processing gases (e.g., a precursor gas and a reaction gas), one cycle may include a first processing step (supplying a precursor gas), a first discharging step, a second processing step (supplying a reaction gas), and a second discharging step. In this case, two gas supply systems may be installed for the precursor gas and the reaction gas.

(Configuration of Main Part)

Next, the openings 234 formed on the peripheral surface of the gas nozzle 340*a* extending in the vertical direction and the discharge hole 344 formed at the tip of the gas nozzle 340*a* will be described.

Figure 5:
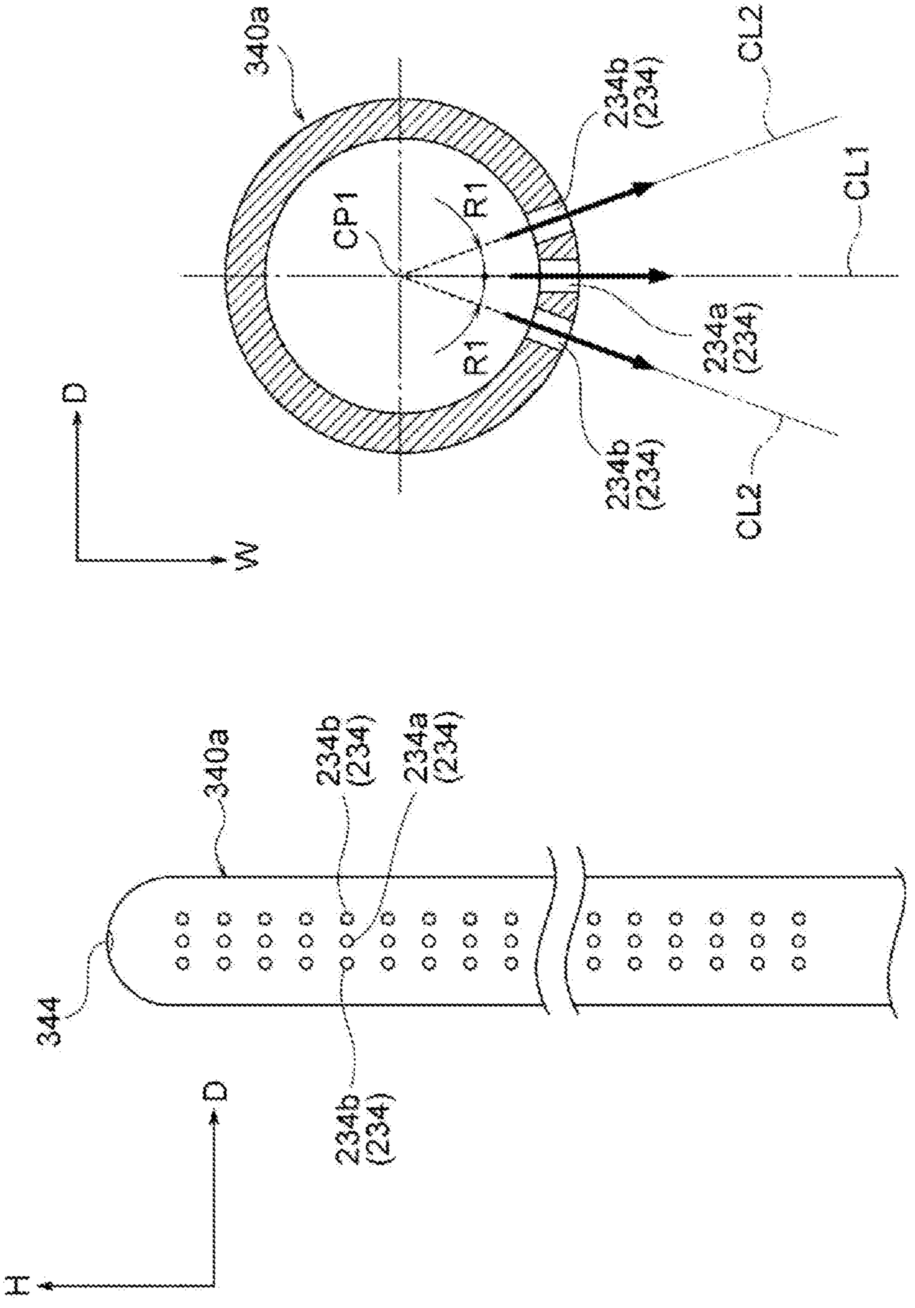
FIG. 5 is a front view and a sectional view showing a gas nozzle installed in the gas supplier according to embodiments of the present disclosure.

As described above, the openings 234 are formed so as to face the supply slits 235*a*, which are arranged in the vertical direction, in the parallel direction (i.e., the horizontal direction). Specifically, as shown in FIG. 5, the openings 234 are arranged in the horizontal direction so as to face one supply slit 235*a* and formed in a plural number (e.g., three). That is, the hole rows of the plurality of openings 234 formed by being arranged in the horizontal direction are arranged in the vertical direction. In other words, the hole rows of the openings 234 are provided so as to be arranged in a direction parallel to the surfaces of the wafers 200.

Further, as shown in FIG. 1, the openings 234 are formed in the middle of the gas flow path in the gas nozzle 340*a* through which a gas flows upward from below. All of the wafers 200 are arranged in the region in which the openings 234 are formed in the vertical direction.

Further, the first openings 234*a* and the second openings 234*b* are formed such that a gas can be supplied to between the wafers 200 stacked in the process chamber 201. Further, as shown in FIG. 5, among the three horizontally aligned openings 234, the central first opening 234*a* is opened so as to supply a gas toward the center of each of the wafers 200. A pair of second openings 234*b* are formed symmetrically with respect to a reference line CL1 passing through the first opening 234*a* and the center CP1 of the gas nozzle 340*a* with the reference line CL1 interposed therebetween. The direction in which the reference line CL1 extends is the direction in which the gas is supplied from the first opening 234*a*.

In this configuration, the first openings 234*a* and the second openings 234*b* inject the gas in a direction intersecting (perpendicular to) the flow direction of the gas flowing inside the gas nozzle 340*a*. Specifically, the first openings 234*a* and the second openings 234*b* inject the gas in the horizontal direction. The gas injected from the first openings 234*a* and the second openings 234*b* is supplied to between the wafers 200 stacked in the process chamber 201.

Further, if an angle at which a reference line CL2 passing through the second opening 234*b* and the center CP1 is inclined with respect to the reference line CL1 is defined as an inclination angle (R1 in FIG. 5), the inclination angle R1 is set to a predetermined angle. That is, the direction of the gas supplied from the second openings 234*b* is inclined by a predetermined inclination angle R1 with respect to the direction of the gas supplied from the first openings 234*a*. Further, the first openings 234*a* and the second openings

234*b* are formed in a circular shape, and the diameters of the first openings 234*a* and the second openings 234*b* are predetermined values.

In this configuration, the gas injected from the first openings 234*a* and supplied to the process chamber 201 is directed toward the centers of the wafers 200, and the gas is injected from the second openings 234*b* and supplied to the process chamber 201 is directed to the peripheral edges of the wafers 200. The shape of the openings 234 in the present embodiment is a circular shape as shown, but is not limited to this shape. The shape of the openings 234 may be an elliptical shape, a triangular shape, a slit-shaped (rectangular) shape, or a pentagonal shape. The same applies to the shape of the discharge hole 344. Further, the discharge hole 344 does not have to be one, and may be a plurality of holes. In this case, it goes without saying that the total cross-sectional area of the plurality of holes forming the discharge hole 344 should be larger than the cross-sectional area of the opening 234.

Figure 16A:
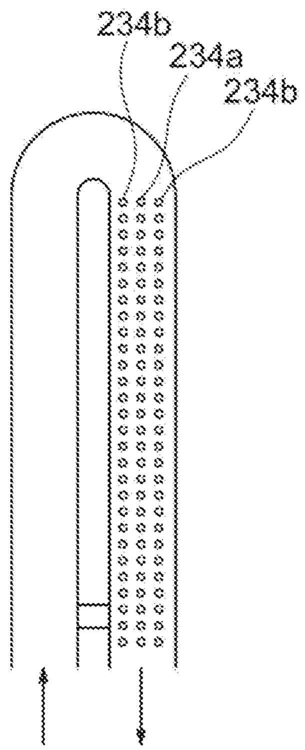
FIG. 16A is a diagram illustrating an example of the gas supplier according to embodiments of the present disclosure.
Figure 16B:
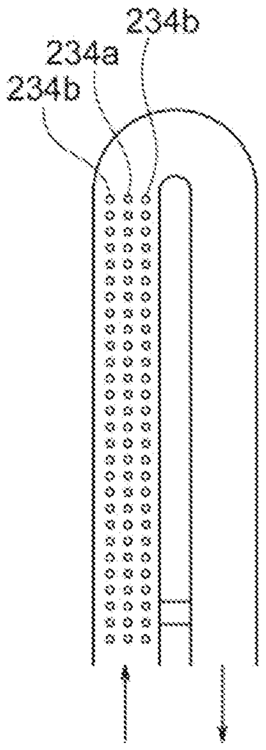
FIG. 16B is a diagram illustrating another example of the gas supplier according to embodiments of the present disclosure.

Further, the gas nozzle 340*a* of the present embodiment is a straight pipe-type nozzle, but is not limited thereto. For example, a folded type (U-turn type) nozzle as shown in FIGS. 16A and 16B may be used. FIG. 16A shows a type in which the first openings 234*a* and the second openings 234*b* are provided behind the folded portion, and FIG. 16B shows a type in which the first openings 234*a* and the second openings 234*b* are provided in front of the folded portion. In addition, although it is not shown in FIGS. 16A and 16B, the openings 234 may be provided behind and in front of the folded portion.

As shown in FIGS. 16A and 16B, in the case of the folded type (U-turn type) nozzle, only the gas supplied from the openings 234 flows toward the wafers 200. In other words, the gas discharged from the discharge hole 344 to be described later is directed downward in the reaction tube 203 and therefore does not affect the processing of the wafers 200.

Herein, a gas flow in case that one row of openings is arranged in the vertical direction like the conventional gas nozzle and a gas flow in case that three rows of the openings 234 like the gas nozzle 340*a* of the present embodiment are arranged in the vertical direction will be described with reference to FIG. 6.

FIG. 6 shows a simulation result of the gas flow in the conventional gas nozzle and a simulation result of the gas flow in the gas nozzle 340*a* of the embodiment. As can be seen from this table, the conventional gas nozzle generates a return flow, and the gas nozzle 340*a* of the embodiment does not generate a return flow. As used herein, the term "return flow" refers to a flow in which a part of the gas injected from the openings 234 flows over the wafers 200 in a U shape and returns from the center side of the wafers 200 to the peripheral side thereof.

In the conventional gas nozzle, the gas is vigorously injected from one row of openings, and therefore a return flow is easily generated. The gas returning as the return flow finally flows near the wafer edge and is exhausted. The return flow is one of the factors that make the film thickness at the wafer edge portion thicker than at other portions. In other words, the return flow is one of the factors that deteriorate the in-plane film thickness uniformity of the wafer.

On the other hand, in the gas nozzle 340*a* of the embodiment, among the three rows of openings 234, the first opening 234*a* faces the center of the wafer 200, and the other two second openings 234*b* are inclined with respect to the reference line CL1. By dispersing and injecting the gas from the three openings 234, it is possible to suppress the generation of the return flow.

FIG. 6 also shows a simulation result of the gas partial pressure ΔPa of the conventional gas nozzle and a simulation result of the gas partial pressure ΔPa of the gas nozzle 340*a* of the embodiment.

Figure 7:
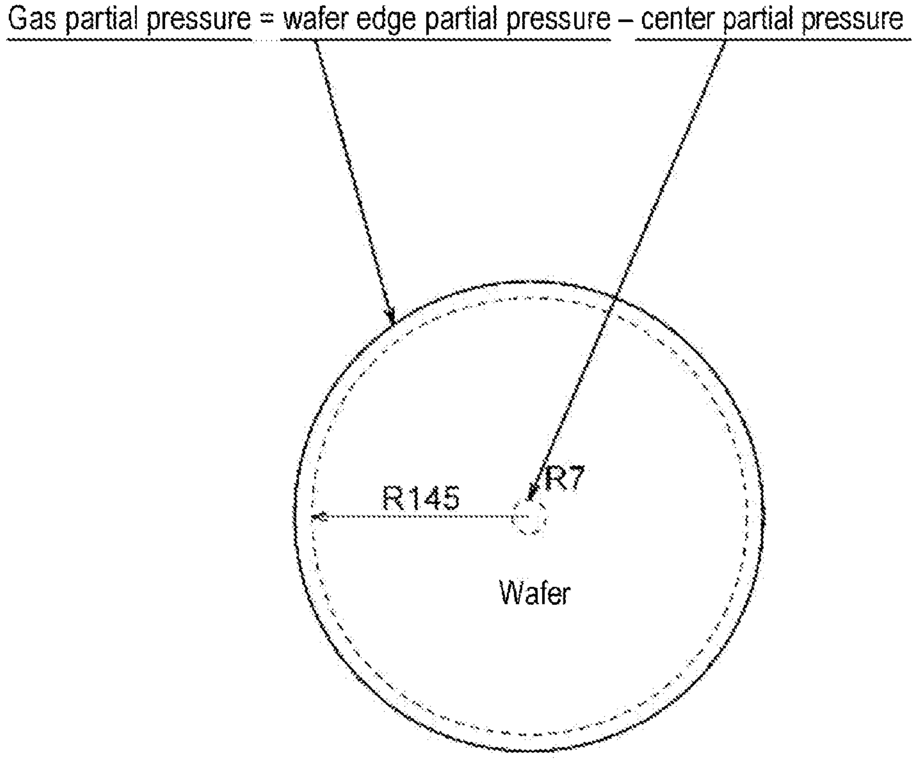
FIG. 7 is an explanatory diagram used to explain a gas partial pressure ΔPa, which is an evaluation index of the gas supplier according to embodiments of the present disclosure.

Now, the "gas partial pressure ΔPa" will be described with reference to FIG. 7. The circumferential average of the gas partial pressure at the edge (145 mm radius region) of a wafer having an outer diameter of 300 mm and the circumferential average of the gas partial pressure at the center (7 mm radius region) of the wafer are calculated. The difference value between the circumferential average of the gas partial pressure at the edge and the circumferential average of the gas partial pressure at the center is defined as a gas partial pressure ΔPa (hereinafter sometimes referred to as "ΔPa").

As shown in FIG. 6, the ΔPa for the conventional gas nozzle is 5.7 Pa, and the ΔPa for the gas nozzle 340*a* of the embodiment is 1.5 Pa. The ΔPa of the gas nozzle 340*a* of the embodiment is smaller than the ΔPa of the conventional gas nozzle. From this ΔPa result, it can be seen that the gas nozzle 340*a* of the embodiment suppresses the generation of the return flow as compared with the conventional gas nozzle.

Further, at the tip (upper end) of the gas nozzle 340*a*, as shown in FIG. 5, a discharge hole 344 is formed to discharge a gas in a direction different from the wafers 200. The hole diameter of the discharge hole 344 is larger than the hole diameter of the first openings 234*a* and the hole diameter of the second openings 234*b*, or the cross-sectional area of the discharge hole 344 is larger than the cross-sectional area of the first openings 234*a* and the cross-sectional area of the second openings 234*b*.

In this configuration, by forming the discharge hole 344 in this way, the gas flowing inside the gas nozzle 340*a* becomes uniform in the vertical direction of the gas nozzle 340*a*. Thus, the flow rate of the gas supplied from each of the first openings 234*a* and the second openings 234*b* becomes uniform in the vertical direction.

Next, the results of the thermal fluid simulations performed by changing the hole diameter of the openings 234 of the gas nozzle 340*a* will be described with reference to the tables shown in FIGS. 8 and 9. The specifications other than the hole diameter are the same values.

In Evaluation Example 1, the ratio of the hole diameter of the first opening 234*a* to the hole diameter of the second opening 234*b* (hole diameter ratio) was 1:1.

In Evaluation Example 2, the ratio of the hole diameter of the first opening 234*a* to the hole diameter of the second opening 234*b* (hole diameter ratio) was 1:0.85.

In Evaluation Example 3, the ratio of the hole diameter of the first opening 234*a* to the hole diameter of the second opening 234*b* (hole diameter ratio) was 1:0.75.

As shown in FIG. 8, regarding the gas flow over the wafer 200, no return flow was generated over the wafer 200 in Evaluation Examples 1 and 2. On the other hand, in Evaluation Example 3, a return flow was generated above the wafer 200. However, the intensity of the return flow in Evaluation Example 3 was suppressed as compared with the return flow in the conventional example (see FIG. 6).

As shown in FIG. 9, the ratio of the cross-sectional area of the second opening 234*b* to the cross-sectional area of the first opening 234*a* was 1 in Evaluation Example 1, 0.7 in Evaluation Example 2, and 0.5 in Evaluation Example 3.

As shown in FIG. 9, the ratio of the flow rate of the gas supplied from the second opening 234*b* to the flow rate of the gas supplied from the first opening 234*a* was substantively 1 in Evaluation Example 1, 0.69 in Evaluation Example 2, and 0.49 in Evaluation Example 3. In the regard, "substantially 1" means ±5% or less of 1.

As shown in the table of FIG. 9, the ΔPa on the wafer 200 was 1.5 Pa in Evaluation Example 1, 2.7 Pa in Evaluation Example 2, and 4.0 Pa in Evaluation Example 3.

[Discussion on Gas Flow Over Wafer]

From the results described above, the critical condition for not generating a return flow is considered to be the specification of Evaluation Example 2. Looking at the gas flow in the simulation of Evaluation Example 2, it seems that a return flow is generated at the edge of the wafer. However, a region of a few millimeters (3 mm to 5 mm) from the edge of the wafer is a region where fine patterns are not formed. Therefore, the specification of Evaluation Example 2 can be regarded as a critical condition under which there is substantially no return flow on the wafer.

That is, the flow rate ratio for not generating a return flow is 0.7 or more and 1.0 or less. The cross-sectional area ratio of the opening for not generating a return flow is 0.7 or more and 1 or less. The upper limit of the ΔPa for not generating a return flow is about 3.0 or less.

Next, the results of the thermal fluid simulation performed by changing the inclination angle R1 of the second opening 234*b* formed in the gas nozzle 340*a* will be described using the table shown in FIG. 10. The specifications other than the inclination angle R1 are the same values.

In Evaluation Example 4, the inclination angle R1 was set to 20 degrees.

In Evaluation Example 5, the inclination angle R1 was set to 25 degrees.

In Evaluation Example 6, the inclination angle R1 was set to 30 degrees.

In Evaluation Example 7, the inclination angle R1 was set to 35 degrees.

In Evaluation Example 8, the inclination angle R1 was set to 45 degrees.

As shown in FIG. 10, in Evaluation Examples 4, 5 and 6, no return flow is generated. As for Evaluation Examples 7 and 8, a return flow is generated. Thus, it can be seen that the return flow does not occur when the inclination angle R1 is 20 degrees or more and 30 degrees or less. The intensity of the return flow in Evaluation Examples 7 and 8 is suppressed as compared with the return flow in the conventional example (see FIG. 6).

As shown in FIG. 10, the ΔPa was 2.6 Pa in Evaluation Example 4, the ΔPa was 2.9 Pa in Evaluation Example 5, the ΔPa was 3.1 Pa in Evaluation Example 6, the ΔPa was 7.8 Pa in Evaluation Example 7, and the ΔPa was 9.7 Pa in Evaluation Example 8. Accordingly, the upper limit of the ΔPa for not generating a return flow is 3.1 Pa or less.

Next, the results of the thermal fluid simulation performed by changing the flow rate of the gas flowing through the gas nozzle 340*a* will be described using the table shown in FIG. 11. The hole diameter of the first opening 234*a* and the second opening 234*b* is set to 2.7 mm, and other specifications have the same values.

In Evaluation Example 9, the gas flow rate was set to 3 slm.

In Evaluation Example 10, the gas flow rate was set to 5.9 slm.

In Evaluation Example 11, the gas flow rate was set to 12 slm.

As shown in the table of FIG. 11, the uniformity of the flow rate of the gas supplied from the first opening 234*a* and the second opening 234*b* was ±1.2% in Evaluation Example 9, ±1.52% in Evaluation Example 10, and ±0.81% in Evaluation Example 11.

[Discussion on Opening 234]

From the table shown in FIG. 11, it can be noted that the flow rate of the gas supplied from the first opening 234*a* tends to be smaller than the flow rate of the gas supplied from the second opening 234*b*. In other words, the smaller the flow rate of the gas supplied from the first opening 234*a*, the higher the uniformity of the flow rate, which desirably results in suppressing the return flow. That is, it is considered that, by making the hole diameter or cross-sectional area of the second opening 234*b* larger than that of the first opening 234*a*, the flow rate of the gas supplied from the first opening 234*a* increases, which is desirable for suppressing the return flow.

Figure 17:
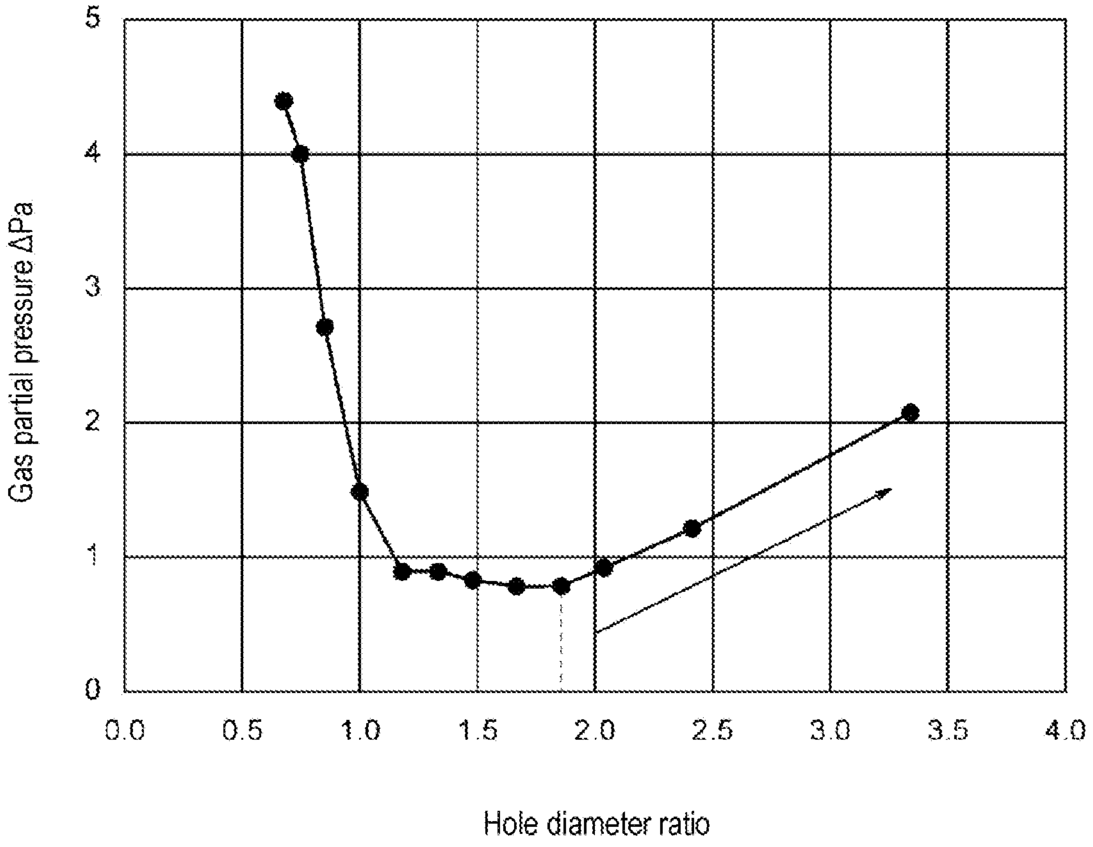
FIG. 17 is a diagram graphically showing a gas partial pressure ΔPa when a hole diameter of a second opening is changed, which is a simulation result of the gas supplier according to embodiments of the present disclosure.

In FIG. 17, a horizontal axis represents a hole diameter ratio of the openings (the hole diameter ratio based on the first opening 234*a*), and a vertical axis represents a gas partial pressure ΔPa. That is, FIG. 17 shows a dependence of the gas partial pressure ΔPa on the hole diameter ratio between the first opening 234*a* and the second opening 234*b*. According to FIG. 17, the return flow is not generated when the value of the gas partial pressure ΔPa is less than about 3. Therefore, it can be noted that even when the hole diameter ratio is maximized (the hole diameter ratio is 3.33 in FIG. 17), the return flow is not generated.

In this regard, the point at which the value of the gas partial pressure ΔPa is 2.7 shown in FIG. 17 is the condition of Evaluation Example 2 shown in FIG. 8. The point at which the value of the gas partial pressure ΔPa is 1.5 is the condition of Evaluation Example 1 shown in FIG. 8. As the hole diameter ratio becomes larger than 1, the value of the gas partial pressure ΔPa decreases. The gas partial pressure ΔPa is gentle at the hole diameter ratio of 1.85, and then is switched to increase. Therefore, it can be seen that the maximum value of the ideal hole diameter ratio is the hole diameter ratio of 1.85.

Referring again to FIG. 17, it can be noted that when the hole diameter ratio is 1.49 or more and 1.85 or less, the value of the gas partial pressure ΔPa is less than 1 and substantially constant (about 0.8) and further that when the hole diameter ratio is 1.2 or more and 2.1 or less, the value of the gas partial pressure ΔPa is about 0.9 or less. That is, it can be determined that if the hole diameter ratio is 1.2 or more and 2.1 or less, the gas uniformly flows over the surface of the wafer 200. Under this condition, the gas can be uniformly supplied to the surface of the wafer 200. Therefore, for example, if the gas contributes to film formation, it is possible to expect the improvement in film formation uniformity in the plane of the wafer.

FIG. 18 extracts four points where the hole diameter ratio is larger than 1 from the 12-point simulation shown in FIG. 17. The hole diameter ratios are 1.19, 1.85, 2.41, and 3.33 sequentially from the left. As can be seen from these figures, the return flow is not generated under any conditions.

Meanwhile, it was found that the generation of the return flow can be suppressed when the flow rate in the second opening 234*b* is larger than the flow rate in the first opening 234*a*. However, it is impossible to explain why the value of the gas partial pressure ΔPa increases when the hole diameter ratio becomes larger than 1.85. Thus, the simulation results for the hole diameter ratios of 2.41 and 3.33 were closely examined. It was found that stagnation is generated in the gas flow from the first opening 234*a*. As shown in FIG. 18, the simulation results for the hole diameter ratios of 2.41 and 3.33 reveal that the flow rates in the second opening 234*b* are about 14 and about 50, respectively, with respect to the flow rates in the first opening 234*a*. The flow rates in the first opening 234*a* is extremely small.

It is considered that the return flow of the gas supplied from the second opening 234*b* is a cause of the phenomenon that when the flow rate in the second opening 234*b* increases and the flow rate in the first opening 234*a* decreases, the value of ΔPa is switched to increase and stagnation occurs. Until now, in order to suppress the flow of the gas through the first opening 234*a*, the gas is supplied from the second opening 234*b* to suppress the generation of the return flow. However, when the flow rate in the second opening 234*b* is too large, the return flow of the gas supplied from the second opening 234*b* is generated, and the gas does not flow in the exhaust direction. A gas flow facing toward the center is generated. Since the flow rate of the gas supplied from the first opening 234*a* is small with respect to the return flow, it is difficult to cancel the return flow. Therefore, it is considered that the gas supplied from the first opening 234*a* is stagnant.

Meanwhile, the reason why the return flow is not generated in the simulation results is considered to be that, in addition to the influence of the gas supplied from the first opening 234*a*, since the second openings 234*b* are provided at two locations so as to sandwich the first opening 234*a*, even if a return flow of the gas supplied from the second opening 234*b* is generated, the flow of the gas toward the center can be successfully canceled. On the other hand, with respect to the flow of the gas not directed toward the center due to the generation of the return flow, it is considered that since the second openings 234*b* are originally provided to face the peripheral edge of the wafer 200, there is substantially no influence on the gas flow on the wafer 200.

The reason why the value of ΔPa increases when the flow rate in the second opening 234*b* increases and the flow rate in the first opening 234*a* decreases is considered to be that the return flow of the gas supplied from the second opening 234*b* causes the stagnation of the gas supplied from the first opening 234*a*. On the other hand, the reason why the value of ΔPa increases when the flow rate in the first opening 234*a* increases and the flow rate in the second opening 234*b* decreases is considered to be that the return flow of the gas supplied from the first opening 234*a* is generated. Returning to FIG. 17, when the hole diameter ratio is smaller than 1.19, i.e., when the return flow of the gas supplied from the first opening 234*a* is generated, ΔPa increases sharply. When the hole diameter ratio is larger than 2.1, i.e., when the stagnation of the gas supplied from the first opening 234*a* is generated, ΔPa increases gently.

The return flow of the gas supplied from the first opening 234*a* has a large influence on the gas flow over the wafer 200, and the influence of the stagnation of the gas supplied from the first opening 234*a* on the gas flow over the wafer 200 is linear. That is, it is considered that the gas flow over the wafer 200 is affected by the flow rate of the gas supplied from the first opening 234*a* rather than the return flow of the gas supplied from the second opening 234*b*. In other words, it can be seen that, for example, when supplying a film-forming contribution gas to the wafer 200, the return flow of the gas supplied from the first opening 234*a* has a large influence. In addition, it is considered that the influence of stagnation of the gas supplied from the first opening 234*a* is relatively small.

Returning to FIG. 18, for example, when the hole diameter ratio is 3.33, ΔPa is 2.1 Pa. Further, the results of the simulation reveal that the return flow is not generated on the wafer 200 (there is no flow indicating the return flow in FIG. 18). This is considered that, since the return flows of the gases supplied from the second openings 234*b* are canceled, the influence of the return flow on ΔPa is considerably small as compared to the first opening 234*a*. However, it is considered ha the influence of stagnation on the wafer 200 facing the first opening 234*a* is greatly reflected. In other words, it is considered that the return flow of the gas supplied from the second opening 234*b* causes stagnation of the gas supplied from the first opening 234*a*, but the influence on ΔPa is indirect.

Returning to FIG. 18, for example, when the hole diameter ratio is 0.85 (Evaluation Example 2), ΔPa is 2.7 Pa. In reality, the simulation results reveal that the return flow is not generated on the wafer 200 (there is no flow indicating the return flow in FIG. 18). Therefore, it has been explained that even if the return flow is generated, the generation of the return flow on the wafer 200 is suppressed. However, strictly speaking, return flows are generated and canceled from each other on the wafer 200.

Returning to FIG. 17, when the hole diameter ratio is 1.19 or more and 2.1 or less, ΔPa is stabilized at a value of 0.8 or more and 0.9 or less. Therefore, it is considered that the return flow is not generated from the first opening 234*a* or the second opening. It seems that even if return flows are generated, they are just canceled from each other.

According to the present embodiments, it can be noted that even if the simulation result indicates the generation of the return flow, it is desirable that ΔPa is 2.7 or less in view of the influence on the processing on the wafer 200. That is, as shown in FIG. 17, it is desirable that the hole diameter ratio is 0.85 or more and 3.33 or less. At this time, the cross-sectional area ratio is 0.7 or more and 11.1 or less. Further, even if return flows are generated, the return flows are suppressed (cancelled from each other) in the simulation results. Thus, as shown in FIG. 18, it is desirable that the gas partial pressure ΔPa is 2.1 or less, the hole diameter ratio shown in FIG. 17 is 0.93 or more and 2.25 or less. Further, conditions that are not affected by stagnation are desirable, and it is desirable that ΔPa is less than 1, for example, 0.9 or less. Therefore, it is desirable that the hole diameter ratio is 1.1 or more and 2.1 or less.

In the above description, the hole diameter ratio has been mainly described. However, the hole diameter ratio is nothing more than one index. The gas flow rate, the cross-sectional area ratio, and the like may also be applicable.

(First Modification)

Figure 12:
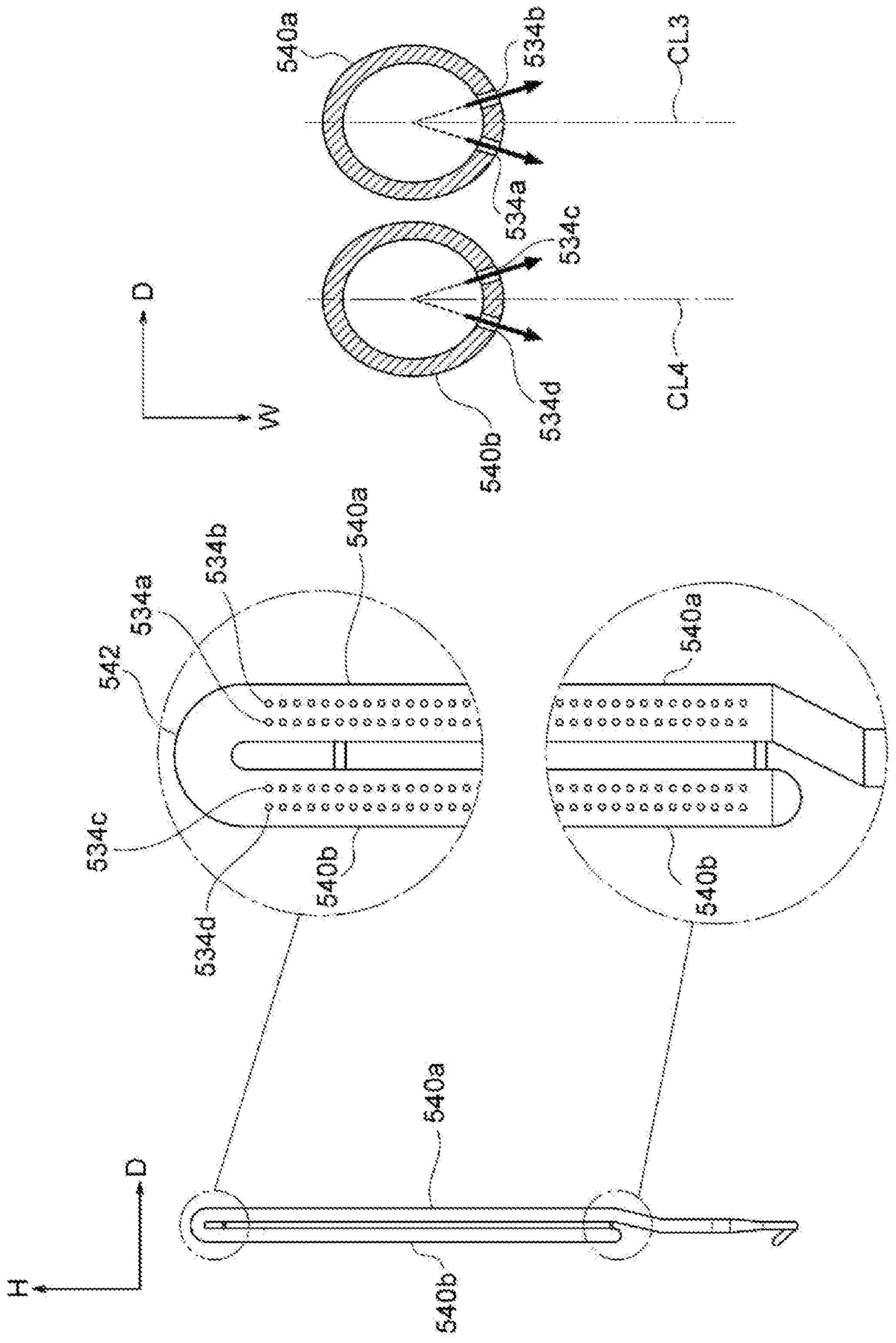
FIG. 12 is a front view and a sectional view showing a first modification of the gas supplier according to embodiments of the present disclosure.

Next, a first modification will be described with reference to FIG. 12. A pair of the gas nozzles 540*a* and 540*b* is installed in the first modification. The upper end of the gas nozzle 540*a* and the upper end of the gas nozzle 540*b* are connected by a U-shaped connecting portion 542 that is opened at the lower side thereof.

Specifically, the gas nozzle 540*a* through which a gas flows upward and the gas nozzle 540*b* through which a gas flows downward are installed. The gas nozzle 540*a* and the gas nozzle 540*b* are arranged in the depth direction of the apparatus. The external shape of the gas nozzles 540*a* and 540*b* is an elliptical shape extending in the width direction of the apparatus.

In the gas nozzle 540*a*, pairs of openings 534 are formed by being arranged in the vertical direction, the openings 534 in each pair being arranged in the horizontal direction. The openings 534 are composed of first openings 534*a* and second openings 534*b*. The first openings 534*a* and the second openings 534*b* are arranged symmetrically with respect to a reference line CL3 extending in the longitudinal direction of the elliptical gas nozzle 540*a*. The first openings 534*a* are disposed to inject a gas toward the side of the gas nozzle 540*b* and the center side of the wafers 200.

Similarly, in the gas nozzle 540*b*, pairs of openings 534 are formed by being arranged in the vertical direction, the openings 534 in each pair being arranged in the horizontal direction. The openings 534 are composed of first openings 534*c* and second openings 534*d*. The first openings 534*c* and the second openings 534*d* are arranged symmetrically with respect to a reference line CL4 extending in the longitudinal direction of the elliptical gas nozzle 540*b*. The first openings 534*c* are arranged to inject a gas toward the side of the gas nozzle 540*a* and the center side of the wafers 200. As used herein, the term "center side" means not only the direction in which the gases supplied from the first openings 534*a* and the first openings 534*c* are mixed at the centers of the wafers 200 but also the direction in which the gases are mixed on the wafers 200. Preferably, the center side is the direction in which the gases are mixed before reaching the centers of the wafers 200.

Further, the first openings 534*a* and the second openings 534*b* formed in the gas nozzle 540*a* and the first openings 534*c* and the second openings 534*d* formed in the gas nozzle 540*b* are formed on the same planes.

In this configuration, the gas injected from the first openings 534*a* of the gas nozzle 540*a* and the gas injected from the first openings 534*c* of the gas nozzle 540*b* are mixed before reaching the wafers 200, or mixed before reaching the centers of wafers 200, that is, between the peripheries and the centers of the wafers 200. In this modification, the U-shaped nozzle is used. However, the shape of the nozzle is not limited to this shape. The nozzle may be a V-shaped nozzle, or may be an N-shaped nozzle or a W-shaped nozzle. Further, it is desirable that the number of the openings (first opening and second opening) is 2 or more, for example, 3 as the present embodiments.

(Second Modification)

Figure 13:
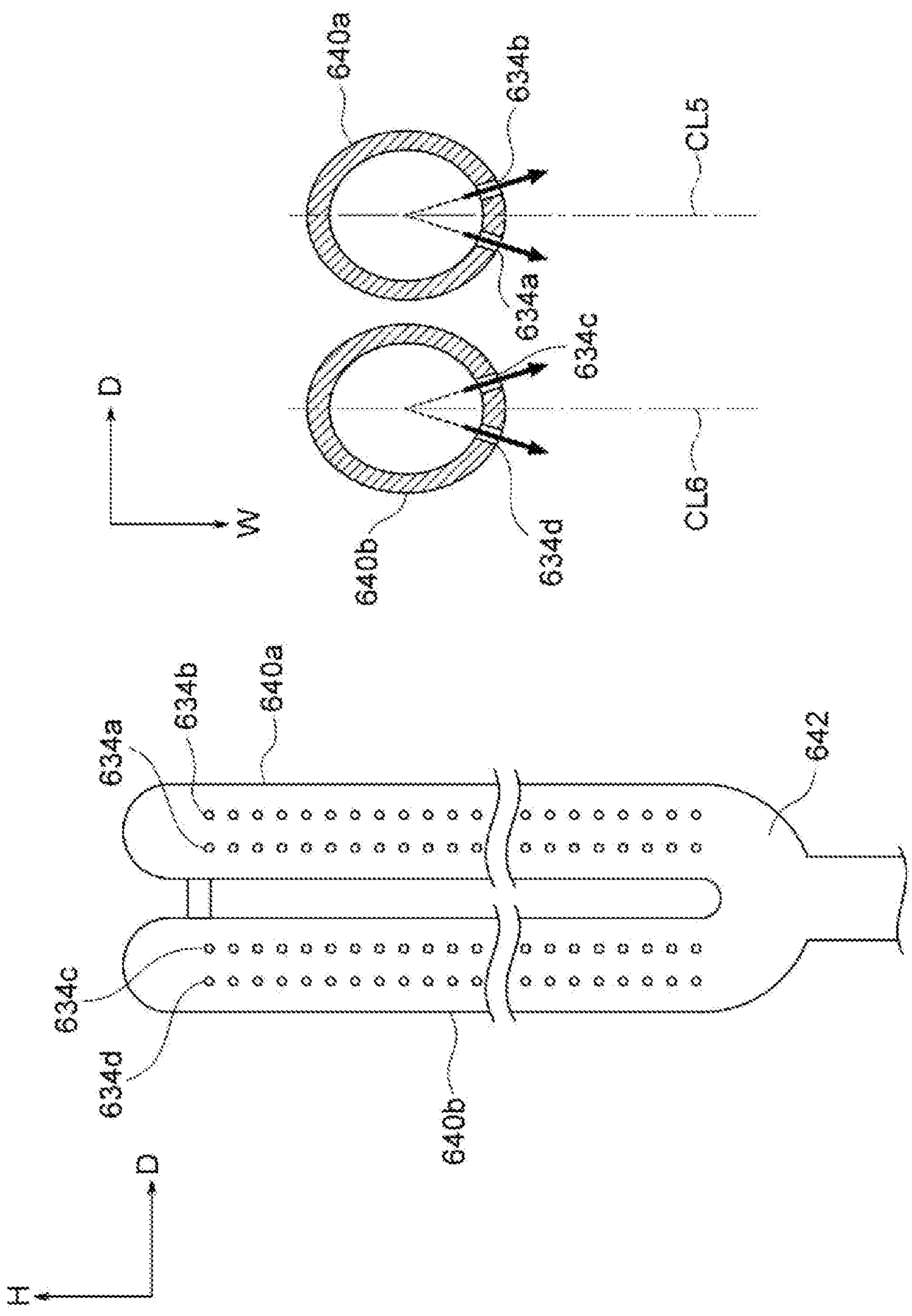
FIG. 13 is a front view and a sectional view showing a second modification of the gas supplier according to embodiments of the present disclosure.

Next, a second modification will be described with reference to FIG. 13. A pair of gas nozzles 640*a* and 640*b* are installed in the second modification. The lower end of the gas nozzle 640*a* and the lower end of the gas nozzle 640*b* are connected by a U-shaped connecting portion 642 that is opened at the upper side thereof. The gas nozzle 640*a* and the gas nozzle 640*b* are arranged side by side in the depth direction of the apparatus. The external shape of the gas nozzles 640*a* and 640*b* is an elliptical shape extending in the width direction of the apparatus.

In the gas nozzle 640*a*, pairs of openings 634 are formed by being arranged in the vertical direction, the openings 634 of the pair being arranged in the horizontal direction. The openings 634 are composed of first openings 634*a* and second openings 634*b*. The first openings 634*a* and the second openings 634*b* are arranged symmetrically with respect to a reference line CL5 extending in the longitudinal direction of the elliptical gas nozzle 640*a*. The first openings 634*a* are arranged to inject a gas toward the side of the gas nozzle 640*b* and the center side of the wafers 200.

Similarly, in the gas nozzle 640*b*, pairs of openings 634 are formed by being arranged in the vertical direction, the openings 634 in each pair being arranged in the horizontal direction. The openings 634 are composed of first openings 634*c* and second openings 634*d*. The first openings 634*c* and the second openings 634*d* are arranged symmetrically with respect to a reference line CL6 extending in the longitudinal direction of the elliptical gas nozzle 640*b*. The first openings 634*c* are arranged to inject a gas toward the side of the gas nozzle 640*a* and the center side of the wafers 200.

Further, the first openings 634*a* and the second openings 634*b* formed in the gas nozzle 640*a* and the first openings 634*c* and the second openings 634*d* formed in the gas nozzle 640*b* are formed on the same planes.

In this configuration, the gas injected from the first openings 634*a* of the gas nozzle 640*a* and the gas injected from the first openings 634*c* of the gas nozzle 640*b* are mixed before reaching the wafers 200, or mixed on the wafers 200. Although only the U-shaped nozzle is used in this modification, the shape of the nozzle is not limited thereto and may be a Y shape. The gas nozzle 640 having the openings 634 may be concave. Further, in this modification, it is desirable that the number of the openings is 2 or more, for example, 3 as the present embodiments.

(Third Modification)

Figure 14:
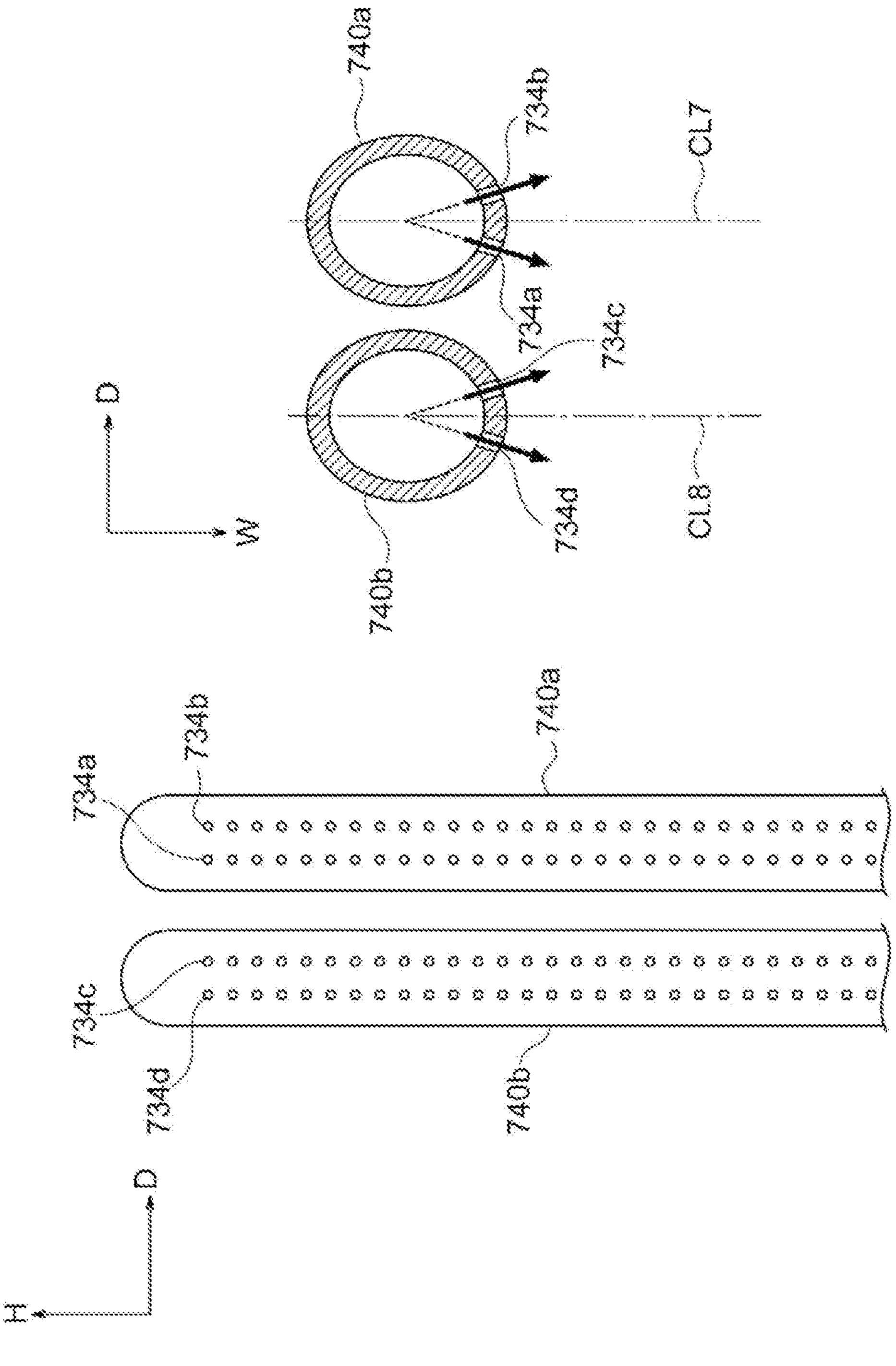
FIG. 14 is a front view and a sectional view showing a third modification of the gas supplier according to embodiments of the present disclosure.

Next, a third modification will be described with reference to FIG. 14. The third modification is directed to a configuration in which a plurality of straight nozzles (straight pipe nozzles) is installed. As shown in FIG. 14, an I-shaped gas nozzle 740*a* and an !-shaped gas nozzle 740*b* for injecting a gas are installed separately. The gas nozzles 740*a* and 740*b* are not connected to each other and are arranged in the depth direction of the apparatus. The external shape of the gas nozzles 740*a* and 740*b* is the shape of an ellipse extending in the width direction of the apparatus.

In the gas nozzle 740*a*, pairs of openings 734 are formed by being arranged in the vertical direction, the openings 734 in each pair being arranged in the horizontal direction. The openings 734 are composed of first openings 734*a* and second openings 734*b*. The first openings 734*a* and the second openings 734*b* are arranged symmetrically with respect to a reference line CL7 extending in the longitudinal direction of the elliptical gas nozzle 740*a*. The first openings 734*a* are arranged to inject a gas toward the side of the gas nozzle 740*b* and the center side of the wafers 200.

Similarly, in the gas nozzle 740*b*, pairs of openings 734 are formed by being arranged in the vertical direction, the openings 734 in each pair being arranged in the horizontal direction. The openings 734 are composed of first openings 734*c* and second openings 734*d*. The first openings 734*c* and the second openings 734*d* are arranged symmetrically with respect to a reference line CL8 extending in the longitudinal direction of the elliptical gas nozzle 740*b*. The first openings 734*c* are arranged to inject a gas toward the side of the gas nozzle 740*a* and the center side of the wafers 200.

Further, the first openings 734*a* and the second openings 734*b* formed in the gas nozzle 740*a* and the first openings 734*c* and the second openings 734*d* formed in the gas nozzle 740*b* are formed on the same planes.

In this configuration, the gas injected from the first openings 734*a* of the gas nozzle 740*a* and the gas injected from the first openings 734*c* of the gas nozzle 740*b* are mixed before reaching the wafers 200. Further, in this modification, it is desirable that the number of the openings is 2 or more, for example, 3 as the present embodiments.

In the present embodiment, the flow rate of the gas supplied from the second openings, the hole diameter of the second openings, and the cross-sectional area of the second openings may be larger than the flow rate of the gas supplied from the first openings, the hole diameter of the first openings, and the cross-sectional area of the first openings, respectively. This makes it possible to suppress the return flow of the gas supplied from the first openings. In addition, since the gases supplied from the first openings and the second openings flow uniformly in the planes of the wafers

200, it is possible to improve the in-plane uniformity of the film thickness of the wafers 200.

Further, in the present embodiment, in the two second openings 234*b*, the flow rate of the gases supplied from the two second openings 234*b*, the hole diameters of the two second openings 234*b*, and the cross-sectional areas of the two second openings 234*b* are substantially the same or the same. However, at least one of them may be substantially the same or the same. This makes it possible to suppress the return flow of the gas supplied from the first openings 234*a*.

Further, in the present embodiment, the inclination angle of the second openings 234*b* with respect to the direction in which the gas supplied from the first openings 234*a* flows can be determined based on the arranged relationship between the first openings 234*a* and the wafers 200 as the objects to be processed. Thus, the gas supplied from the second openings 234*b* can be supplied in the direction toward the peripheral edges of the wafers 200 in the process chamber 201. Accordingly, it is possible to suppress the return flow of the gas supplied from the first openings 234*a*.

According to the present embodiment, at least one of the following effects (1) to (12) may be obtained.

(1) According to the present embodiment, as can be noted from the results of each thermal fluid simulation, the gas injected from the second openings 234*b* and supplied to the process chamber 201 suppresses the return flow of the gas injected from the first openings 234*a* and supplied to the process chamber 201. Thus, the gases supplied from the first openings 234*a* and the second openings 234*b* flow uniformly in the plane of the wafer 200. Therefore, as compared with the conventional configuration, it is possible to improve the uniformity of the film thickness in the plane of the wafer 200.

(2) According to the present embodiment, as in Evaluation Examples 1, 2, 12, 13, 14, and 15 shown in the table of FIG. 9 and FIG. 18, by setting the flow rate of the gas supplied from the second openings 234*b* to 0.7 or more and 49.0 or less with respect to the flow rate of the gas supplied from the first openings 234*a*, it is possible to suppress the return flow of the gas as compared with Evaluation Example 3. As a result, the gases supplied from the first openings 234*a* and the second openings 234*b* flow uniformly in the plane of the wafer 200. Accordingly, the uniformity of the film thickness in the plane of the wafer 200 can be improved as compared with Evaluation Example 3.

(3) According to the present embodiment, as in Evaluation Examples 1, 2, 12, 13, 14, and 15 shown in the table of FIG. 9, by setting the cross-sectional area of the second openings to 0.7 or more and 11.1 or less with respect to the cross-sectional area of the first openings, it is possible to suppress the return flow of the gas as compared with Evaluation Example 3. As a result, the gases supplied from the first openings 234*a* and the second openings 234*b* flow uniformly in the plane of the wafer 200. Accordingly, the uniformity of the film thickness in the plane of the wafer 200 can be improved as compared with Evaluation Example 3.

(4) According to the present embodiment, as in Evaluation Examples 1, 2, 12, 13, 14, and 15 shown in the table of FIG. 8, by setting the hole diameter ratio with respect to the hole diameter of the second openings 234*b* to 0.85 or more and 3.33 or less with respect to the hole diameter of the first openings 234*a*, it is possible to suppress the return flow of the gas as compared with Evaluation Example 3. As a result, the gases supplied from the first openings 234*a* and the second openings 234*b* flow uniformly in the plane of the wafer 200. Accordingly, the uniformity of the film thickness in the plane of the wafer 200 can be improved as compared with Evaluation Example 3.

(5) According to the present embodiment, as in Evaluation Examples 4 to 6 shown in the table of FIG. 10, by setting the inclination angle R1 of the second openings 234*b* to 20 degrees or more and 30 degrees or less, it is possible to suppress the return flow of the gas as compared with Evaluation Examples 7 and 8. As a result, the gases supplied from the first openings 234*a* and the second openings 234*b* flow uniformly in the plane of the wafer 200. Accordingly, the uniformity of the film thickness in the plane of the wafer 200 can be improved as compared with Evaluation Examples 7 and 8.

(6) According to the present embodiment, there are provided two second openings 234*b*. As in Examples 1, 2, 3, 12, 13, 14, and 15 shown in the tables of FIGS. 8, 9, and 18, the flow rates of the gases supplied from the two second openings 234*b* are substantially the same or the same. As a result, it is possible to suppress the return flow of the gas supplied from the first openings 234*a*. Further, the gases supplied from the first openings 234*a* and the second openings 234*b* flow uniformly in the plane of the wafer 200. Accordingly, the uniformity of the film thickness in the plane of the wafer 200 can be improved as compared with the conventional configuration.

In the present disclosure, "substantially the same" means that the other is within ±95% of one as a reference.

(7) According to the present embodiment, there are provided two second openings 234*b*. As in Examples 1, 2, 3, 12, 13, 14, and 15 shown in the tables of FIGS. 8, 9, and 18, the respective hole diameters of the two second openings 234*b* are the same. As a result, it is possible to suppress the return flow of the gas supplied from the first openings 234*a*. Further, the gases supplied from the first openings 234*a* and the second openings 234*b* flow uniformly in the plane of the wafer 200. Accordingly, the uniformity of the film thickness in the plane of the wafer 200 can be improved as compared with the conventional configuration.

(8) According to the present embodiment, there are provided two second openings 234*b*. As in Examples 1, 2, 3, 12, 13, 14, and 15 shown in the tables of FIGS. 8, 9, and 18, the cross-sectional areas of the two second openings 234*b* are the same. As a result, it is possible to suppress the return flow of the gas supplied from the first openings 234*a*. Further, the gases supplied from the first openings 234*a* and the second openings 234*b* flow uniformly in the plane of the wafer 200. Accordingly, the uniformity of the film thickness in the plane of the wafer 200 can be improved as compared with the conventional configuration.

(9) According to the present embodiment, the discharge hole 344 is formed at the tip of the gas nozzle 340*a*. Therefore, the gas flowing inside the gas nozzle 340*a* is uniform in the vertical direction of the gas nozzle 340*a*, whereby the flow rates of the gases supplied from the first openings 234*a* and the second openings 234*b* can be made uniform in the vertical direction.

(10) According to the present embodiment, the first openings 234*a* and the second openings 234*b* are formed such that the gas is supplied to between the wafers 200 stacked in the process chamber 201. As a result, the gas supplied to between the wafers 200 can be made uniform by making the flow rate of the gas supplied from the first openings 234*a* smaller that the flow rate of the gas supplied from the second openings 234*b*. Further, the same applies to the hole diameter ratio (hole diameter) and the cross-sectional area ratio (cross-sectional area).

(11) According to the present embodiment, the gas supplied from the first openings 534*a* or 634*a* of one gas nozzle 540*a* or 640*a* and the gas supplied from the first openings 534*c* or 634*c* of the other gas nozzle 540*b* or 640*b* are mixed before reaching the wafers 200. As a result, the gases supplied from the respective first openings 534*a*, 534*c*, 634*a* and 634*c* are mixed and then evenly supplied onto the wafers 200. Therefore, the gas uniformly flows in the plane of the wafer 200 without generating a return flow on the wafer 200, which makes it possible to improve the in-plane uniformity of the film thickness.

(12) According to the present embodiment, the gas supplied from the first openings 734*a* of one gas nozzle 740*a* and the gas supplied from the first openings 734*c* of the other gas nozzle 740*b* are mixed with each other before reaching the wafers 200. As a result, the gases supplied from the respective first openings 734*a* and 734*c* are mixed and then supplied evenly onto the wafers 200. Therefore, the gas uniformly flows in the plane of the wafer 200 without generating a return flow on the wafer 200, which makes it possible to improve the in-plane uniformity of the film thickness of the wafer 200.

<Another Modification>

Another modification of the present disclosure will be described below with reference to FIG. 15. The same parts as those of the present embodiment will not be described, and the parts different from those of the present embodiment will be mainly described.

Figure 15:
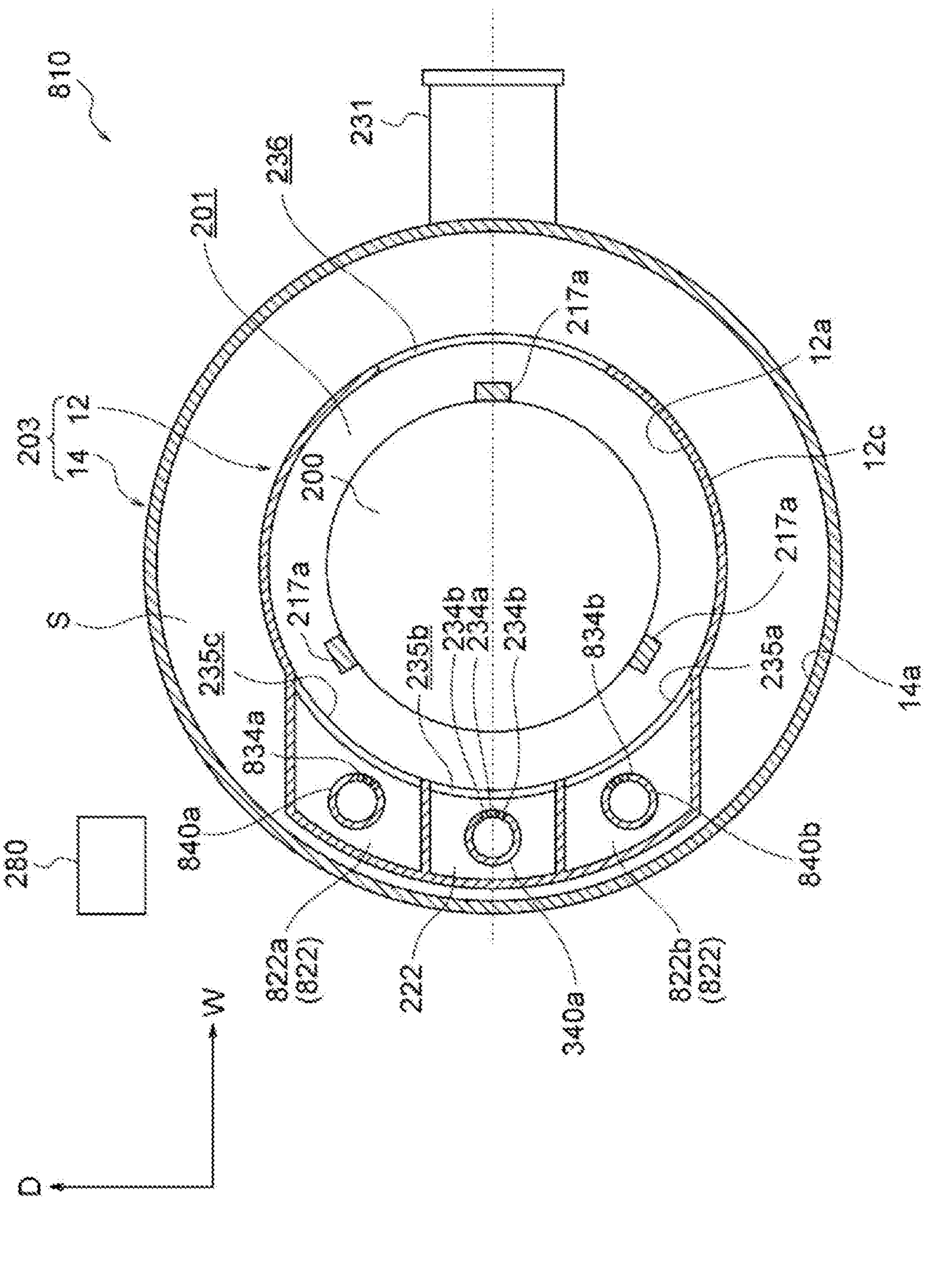
FIG. 15 is a diagram showing a gas supplier, a reaction tube, and the like of a substrate processing apparatus according to a modification of embodiments of the present disclosure.

As shown in FIG. 15, a pair of vertically extending nozzle chambers 822 are installed on both sides of the nozzle chamber 222 in the circumferential direction of the reaction tube 203. Specifically, the nozzle chamber 822*a* is installed on the back side in the apparatus depth direction, and the nozzle chamber 822*b* is installed on the front side in the apparatus depth direction.

A gas nozzle 840*a* is arranged in the nozzle chamber 822*a*. The gas nozzle 840*a* is configured as an I-shaped long nozzle. A gas nozzle 840*b* is arranged in the nozzle chamber 822*b*. The gas nozzle 840*b* is configured as an I-shaped long nozzle.

In the gas nozzles 840*a* and 840*b*, circular openings 834*a* and 834*b* are formed one above another in the vertical direction. An inert gas is injected toward the process chamber 201 from openings 834*a* and 834*b* of the gas nozzles 840*a* and 840*b*. A second gas supplier 842 is configured to include the gas nozzles 840*a* and 840*b* having the circular openings 834*a* and 834*b*.

In this configuration, the flow rate of the gas supplied from the openings 834*a* and 834*b* of the gas nozzles 840*a* and 840*b* is different from the flow rate of the gas supplied from the second openings 234*b* and the flow rate of the gas supplied from the first openings 234*a*. Further, while the gas is being injected from the openings 234 of the gas nozzle 340*a*, a small amount of inert gas is injected from the openings 834*a* and 834*b* of the gas nozzles 840*a* and 840*b*. This suppresses back diffusion. The flow rate of the inert gas injected from the openings 834*a* and 834*b* is suppressed to the extent that it does not contribute to the flow of the gas injected from the openings 234.

It should be apparent to those skilled in the art that the present disclosure is not limited to the embodiment and various other embodiments are adoptable. For example, although not specifically described in the above embodiment, the number of second openings may be larger than the number of first openings.

Moreover, in the above embodiment, the first openings and the second openings are installed separately. However, for example, it may be possible to adopt a slit type in which the gas injected from the first openings is injected toward the centers of the wafers 200 in the process chamber, the gas injected from the second openings is injected toward the peripheries of the wafers 200 in the process chamber 201, and the first openings and the second openings are continuously provided.

Further, the substrate processing apparatuses 10 and 810 may be used not only in semiconductor manufacturing apparatuses, but also in apparatuses for processing glass substrates, such as LCD apparatuses and the like.

Further, the film-forming process may be, for example, a CVD process, a PVD process, a process of forming an oxide film, a nitride film, or both, a process of forming a film containing a metal, or the like. In addition, the present embodiment may be applied to processes such as an annealing process, an oxidation process, a nitriding process, a diffusion process, and the like.

According to the present disclosure in some embodiments, it is possible to allow a processing gas to flow evenly over a substrate.

While certain embodiments have been described, these embodiments have been presented by way of example only, and are not intended to limit the scope of the disclosures. Indeed, the embodiments described herein may be embodied in a variety of other forms. Furthermore, various omissions, substitutions, and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A gas supplier comprising:

at least one nozzle that supplies gas to a process chamber in which a substrate is arranged, wherein the at least one nozzle comprises at least one first opening, a second opening and a third opening that are arranged in a direction parallel to a surface of the substrate, wherein the at least one first opening is configured to supply the gas toward a center of the substrate, wherein the second opening is configured to direct the gas only toward a peripheral edge of the substrate, wherein the third opening is configured to direct the gas only toward another peripheral edge of the substrate, wherein a direction of the gas supplied from each of the second opening and the third opening forms a predetermined angle with respect to a direction of the gas supplied from the at least one first opening, wherein the predetermined angle formed by the direction of the gas supplied from each of the second opening and the third opening with respect to the direction of the gas supplied from the at least one first opening is 20 degrees or more and 30 degrees or less, and wherein the at least one first opening, the second opening and the third opening are configured such that the gas supplied from each of the second opening and the third opening toward the peripheral edge of the substrate flows to cancel or suppress a return flow of the gas from the at least one first opening toward the peripheral edge of the substrate, within an in-plane region of the substrate.

2. The gas supplier of claim 1, wherein a flow rate of the gas supplied from each of the second opening and the third opening is 0.7 or more and 49.0 or less with respect to a flow rate of the gas supplied from the at least one first opening.

3. The gas supplier of claim 1, wherein an area of each of the second opening and the third opening is 0.7 or more and 11.1 or less with respect to an area of the at least one first opening.

4. The gas supplier of claim 1, wherein the at least one first opening, the second opening and the third opening are made in a circular shape, and wherein a hole diameter of each of the second opening and the third opening is 0.85 or more and 3.3 or less with respect to a hole diameter of the at least one first opening.

5. The gas supplier of claim 1, wherein at least one selected from the group of flow rates of gases supplied from the second opening and the third opening, hole diameters of the second opening and the third opening, and areas of the second opening and the third opening are substantially the same.

6. The gas supplier of claim 1, wherein the at least one nozzle is arranged in the process chamber so as to extend in a vertical direction with respect to the surface of the substrate, the gas flowing in the at least one nozzle along the vertical direction, wherein the at least one first opening, the second opening and the third opening are installed on a wall of the nozzle, and wherein the gas supplier is configured to disperse and supply the gas in a direction intersecting the direction in which the gas flows in the vertical direction.

7. The gas supplier of claim 1, wherein each of the second opening and the third opening is configured to form a flow of the gas supplied from each of the second opening and the third opening toward the peripheral edge of the substrate within an in-plane region of the substrate.

8. The gas supplier of claim 1, wherein a flow rate of the gas supplied from each of the second opening and the third opening, a hole diameter of each of the second opening and the third opening, and an area of each of the second opening and the third opening are made larger than a flow rate of the gas supplied from the at least one first opening, a hole diameter of the at least one first opening, and an area of the at least one first opening, respectively.

9. The gas supplier of claim 1, wherein the at least one first opening, the second opening and the third opening are installed in a plural number, and wherein gases supplied from the second openings and the third openings are not mixed with each other.

10. The gas supplier of claim 1, wherein a plurality of supply pipe portions in which the at least one first opening, the second opening and the third opening are formed are installed, and the plurality of supply pipe portions are connected by a U-shaped or Y-shaped connecting portion.

11. The gas supplier of claim 1, wherein the at least one first opening is installed in a plural number, and wherein the gases supplied from the respective first openings are mixed before reaching the substrate.

12. The gas supplier of claim 1, wherein the at least one first opening is installed in a plural number, wherein the gases supplied from the respective first openings are mixed before reaching the center of the substrate.

13. A processing apparatus, comprising:

a first gas supplier including at least one nozzle that supplies gas to a process chamber in which a substrate is arranged, wherein the at least one nozzle comprises at least one first opening, a second opening and a third opening that are arranged in a direction parallel to a surface of the substrate, wherein the at least one first opening is configured to supply the gas toward a center of the substrate, wherein the second opening is configured to direct the gas only toward a peripheral edge of the substrate, wherein the third opening is configured to direct the gas only toward another peripheral edge of the substrate, wherein a direction of the gas supplied from each of the second opening and the third opening forms a predetermined angle with respect to a direction of the gas supplied from the at least one first opening, wherein the predetermined angle formed by the direction of the gas supplied from each of the second opening and the third opening with respect to the direction of the gas supplied from the at least one first opening is 20 degrees or more and 30 degrees or less, and wherein the at least one first opening, the second opening and the third opening are configured such that the gas supplied from each of the second opening and the third opening toward the peripheral edge of the substrate flows to cancel or suppress a return flow of the gas from the at least one first opening toward the peripheral edge of the substrate, within an in-plane region of the substrate.

14. The processing apparatus of claim 13, wherein an angle formed by the direction of the gas supplied from each of the second opening and the third opening with respect to the direction of the gas supplied from the at least one first opening is determined based on an arrangement relationship between the at least one first opening of the first gas supplier and the substrate.

15. The processing apparatus of claim 13, wherein the first gas supplier is installed in a plural number, and wherein the respective gases supplied from the first openings of the first gas suppliers are mixed with each other.

16. The processing apparatus of claim 13, further comprising:

second gas suppliers installed on both sides of the first gas supplier and configured to supply a gas different from the gases supplied from the first gas supplier to the process chamber.

17. A method of manufacturing a semiconductor device, comprising:

processing a substrate by supplying a gas to a process chamber using a gas supplier including at least one nozzle that supplies the gas to the process chamber in which the substrate is arranged, wherein the at least one nozzle comprises at least one first opening, a second opening and a third opening that are arranged in a direction parallel to a surface of the substrate, wherein the at least one first opening is configured to supply the gas toward a center of the substrate, wherein the second opening is configured to direct the gas only toward a peripheral edge of the substrate, wherein the third opening is configured to direct the gas only toward another peripheral edge of the substrate, wherein a direction of the gas supplied from each of the second opening and the third opening forms a predetermined angle with respect to a direction of the gas supplied from the at least one first opening, wherein the predetermined angle formed by the direction of the gas supplied from each of the second opening and the third opening with respect to the direction of the gas supplied from the at least one first opening is 20 degrees or more and 30 degrees or less, and wherein the at least one first opening, the second opening and the third opening are configured such that the gas supplied from each of the second opening and the third opening toward the peripheral edge of the substrate flows to cancel or suppress a return flow of the gas from the at least one first opening toward the peripheral edge of the substrate, within an in-plane region of the substrate.

* * * * *